(12) United States Patent  (10) Patent No.: US 8,699,259 B2
Zhang et al.                (45) Date of Patent:    Apr. 15, 2014

(54) NON-VOLATILE STORAGE SYSTEM USING OPPOSITE POLARITY PROGRAMMING SIGNALS FOR MIM MEMORY CELL

(75) Inventors: Jingyan Zhang, Santa Clara, CA (US); Utthaman Thirunavukkarasu, San Jose, CA (US); April D Schricker, Palo Alto, CA (US)

(73) Assignee: SanDisk 3D LLC, Milpitas, CA (US)

( * ) Notice: Subject to any disclaimer, the term of this patent is extended or adjusted under 35 U.S.C. 154(b) by 78 days.

(21) Appl. No.: 13/410,848

(22) Filed: Mar. 2, 2012

(65) Prior Publication Data

US 2012/0224413 A1    Sep. 6, 2012

Related U.S. Application Data

(60) Provisional application No. 61/448,603, filed on Mar. 2, 2011.

(51) Int. Cl.
*G11C 11/00* (2006.01)
*H01L 29/02* (2006.01)
*H01L 47/00* (2006.01)

(52) U.S. Cl.
USPC ............. 365/148; 365/163; 257/2; 257/4

(58) Field of Classification Search
USPC ....................................... 365/148
See application file for complete search history.

(56) References Cited

U.S. PATENT DOCUMENTS

| | | | |
|---|---|---|---|
| 6,034,882 A | 3/2000 | Johnson et al. | |
| 6,706,402 B2 | 3/2004 | Rueckes et al. | |
| 6,960,783 B2 | 11/2005 | Lan et al. | |
| 7,227,178 B2 | 6/2007 | Kawakami et al. | |
| 7,682,920 B2 | 3/2010 | Herner | |
| 7,897,453 B2 * | 3/2011 | Chen et al. | 438/237 |
| 7,960,216 B2 | 6/2011 | Phatak | |
| 7,977,667 B2 | 7/2011 | Schricker et al. | |
| 8,014,185 B2 * | 9/2011 | Scheuerlein | 365/100 |
| 8,018,024 B2 | 9/2011 | Herner | |
| 8,110,476 B2 * | 2/2012 | Scheuerlein et al. | 438/386 |
| 8,284,589 B2 * | 10/2012 | Scheuerlein | 365/148 |
| 8,431,417 B2 * | 4/2013 | Schricker | 438/3 |
| 8,466,044 B2 * | 6/2013 | Xu | 438/478 |
| 2007/0114508 A1 | 5/2007 | Herner et al. | |
| 2008/0217732 A1 | 9/2008 | Kreupl | |
| 2010/0044671 A1 | 2/2010 | Schricker | |

(Continued)

OTHER PUBLICATIONS

Banhard, Florian, "Interactions between metals and carbon nanotubes: at the interface between old and new materials," The Royal Society of Chemistry 2009, Aug. 28, 2009, 13 pages.

(Continued)

*Primary Examiner* — Son Mai
(74) *Attorney, Agent, or Firm* — Vierra Magen Marcus LLP

(57) ABSTRACT

A reversible resistance-switching metal-insulator-metal (MIM) stack is provided which can be set to a low resistance state with a first polarity signal and reset to a higher resistance state with a second polarity signal. The first polarity signal is opposite in polarity than the second polarity signal. In one approach, the MIM stack includes a carbon-based reversible resistivity switching material such as a carbon nanotube material. The MIM stack can further include one or more additional reversible resistivity switching materials such as metal oxide above and/or below the carbon-based reversible resistivity switching material. In another approach, a metal oxide layer is between separate layers of carbon-based reversible resistivity switching material.

12 Claims, 19 Drawing Sheets

(56) References Cited

U.S. PATENT DOCUMENTS

| | | | |
|---|---|---|---|
| 2010/0102291 A1* | 4/2010 | Xu | 257/4 |
| 2010/0142256 A1 | 6/2010 | Kumar et al. | |
| 2010/0148324 A1* | 6/2010 | Chen et al. | 257/656 |
| 2011/0133151 A1* | 6/2011 | Li et al. | 257/4 |
| 2011/0204474 A1 | 8/2011 | Kreupl et al. | |
| 2011/0310655 A1 | 12/2011 | Kreupl et al. | |
| 2012/0001150 A1 | 1/2012 | Schricker et al. | |

OTHER PUBLICATIONS

Jeong, et al., "Graphene Oxide Thin Flims for Flexible Nonvolatile Memory Applications," Nano Letters, May 28, 2010, 6 pages.

Kang, et al., "One-dimensional heat conduction model for an electrical phase change random access memory device with an 8 F2 memory cell (F = 0.15 μm)," Journal of Applied Physics, vol. 94, No. 5, Sep. 1, 2003, 7 pages.

Malhi, et al., "Characteristics and Three-Dimensional Integration of MOSFET's in Small-Grain LPCVD Polycrystalline Silicon," IEEE Journal of Solid-State Circuits, vol. SC-20, No. 1, Feb. 1985, 24 pages.

Waser, et al., "Nanoionics-based resistive switching memories," Nature Materials, vol. 6, Nov. 2007, 8 pages.

* cited by examiner

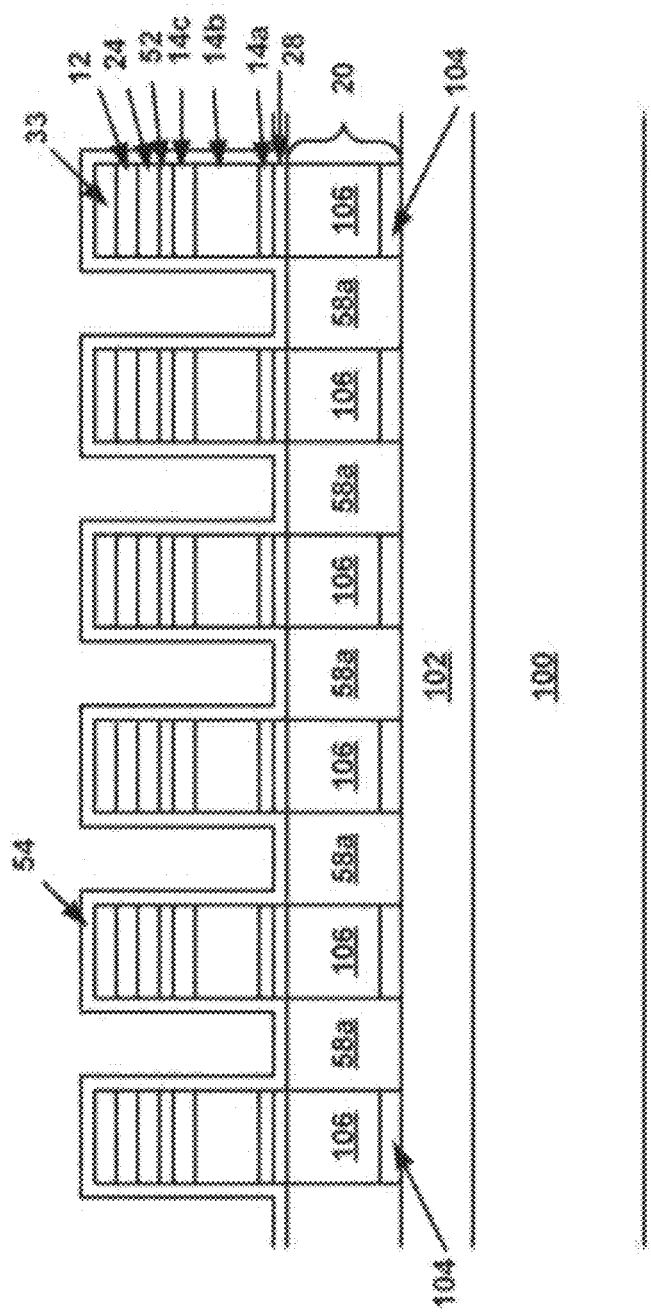

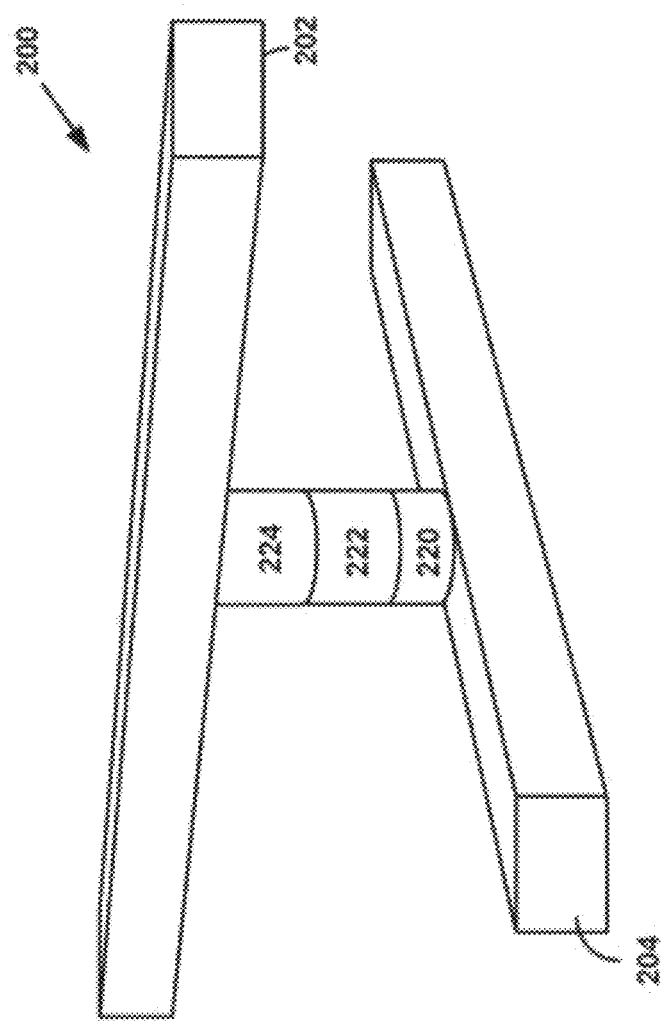

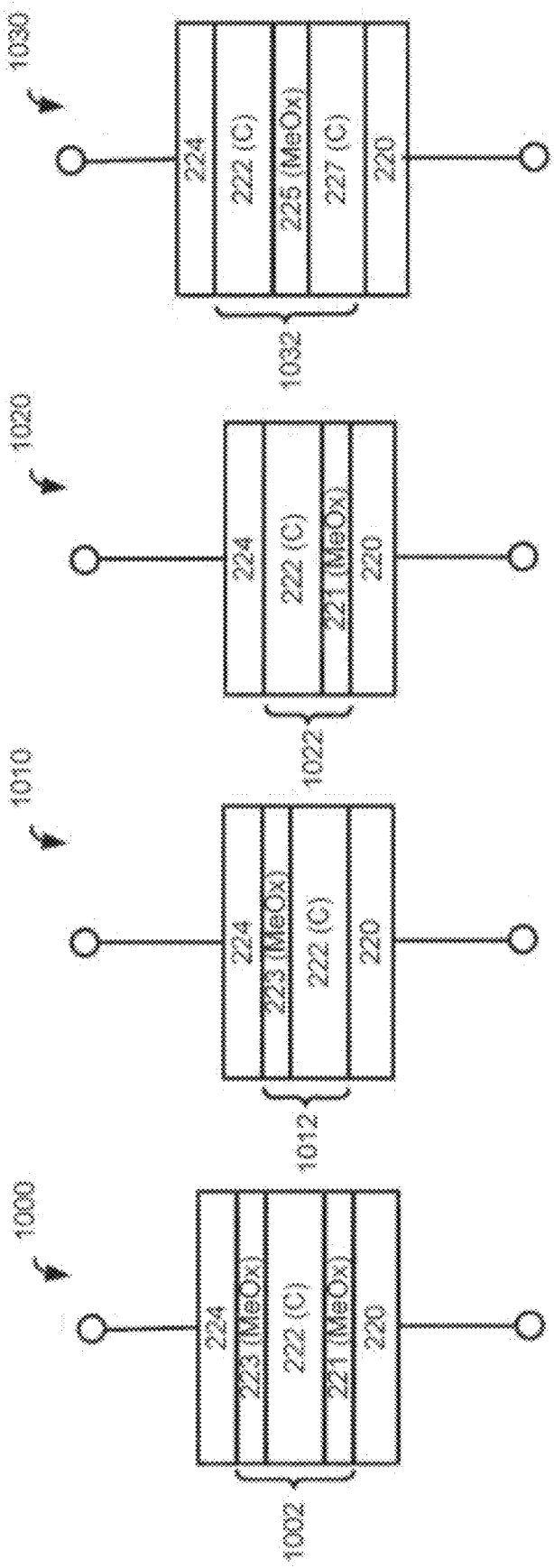

NON-VOLATILE STORAGE SYSTEM USING OPPOSITE POLARITY PROGRAMMING SIGNALS FOR MIM MEMORY CELL

CROSS-REFERENCE TO RELATED APPLICATIONS

This application claims the benefit of U.S. provisional patent application No. 61/448,603, filed Mar. 2, 2011, incorporated herein by reference.

BACKGROUND

1. Field

The present invention relates to technology for data storage.

2. Description of the Related Art

Non-volatile memories formed from reversible resistance switching elements are known. For example, U.S. patent application Ser. No. 11/968,154, filed Dec. 31, 2007, titled "Memory Cell That Employs A Selectively Fabricated Carbon Nano-Tube Reversible Resistance Switching Element And Methods Of Forming The Same" (the "'154 Application"), published as US2009/0168491 on Jul. 2, 2009, which is hereby incorporated by reference herein in its entirety for all purposes, describes a rewriteable non-volatile memory cell that includes a diode coupled in series with a carbon-based reversible resistivity switching material.

However, fabricating memory devices from carbon-based materials is technically challenging, and improved methods of forming memory devices that employ carbon-based materials are desirable.

BRIEF DESCRIPTION OF THE DRAWINGS

FIGS. 4A-4G illustrate cross-sectional views of a portion of a substrate during an exemplary fabrication of a single memory level.

FIG. 5 depicts another embodiment of a memory cell.

FIG. 10A depicts a memory cell 1000 which is provided by modifying the MIM memory cell 200 of FIG. 5 by providing a metal oxide layer 223 between the top electrode 224 and the carbon-based reversible resistance switching element 222, and a metal oxide layer 221 between the bottom electrode 220 and the carbon-based reversible resistance switching element 222.

FIG. 10B depicts a memory cell 1010 which is provided by modifying the MIM memory cell 200 of FIG. 5 by providing a metal oxide layer 223 between the top electrode 224 and the carbon-based reversible resistance switching element 222.

FIG. 10C depicts a memory cell 1020 which is provided by modifying the MIM memory cell 200 of FIG. 5 by providing a metal oxide layer 221 between the bottom electrode 220 and the carbon-based reversible resistance switching element 222.

FIG. 10D depicts a memory cell 1030 which is provided by modifying the MIM memory cell 200 of FIG. 5 by providing an additional carbon-based reversible resistance switching element 227, and a metal oxide layer 225 between the carbon-based reversible resistance switching elements 222 and 227.

DETAILED DESCRIPTION

Figure 1:
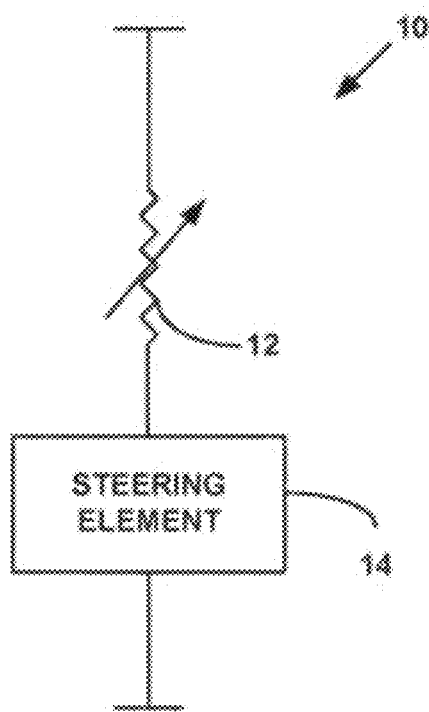
FIG. 1 is a diagram of an exemplary memory cell.

Some carbon nanotube ("CNT") materials may exhibit resistivity switching properties that may be used to form microelectronic non-volatile memories. Such films therefore are candidates for integration within a non-volatile three-dimensional memory array.

Indeed, CNT materials have demonstrated memory switching properties on lab-scale devices with a 100× separation between ON and OFF states and mid-to-high range resistance changes. Such a separation between ON and OFF states renders CNT materials viable candidates for memory cells in which the CNT material is coupled in series with vertical diodes, thin film transistors or other steering elements. For example, MIM stack formed from a CNT material sandwiched between two metal or otherwise conducting layers (commonly referred to as top and bottom electrodes. although any orientation may be used, and the top and bottom electrodes may also be referred to as first and second electrodes) may serve as a resistance-switching element for a memory cell.

In particular, a CNT MIM stack may be integrated in series with a diode or transistor to create a read-writable memory device as described, for example, in the previously incorporated US2009/0168491.

Manufacturing high-yield memory devices that include CNT MIM stacks has proven difficult. A CNT MIM stack is typically fabricated by forming a bottom electrode material, depositing CNT material on the bottom electrode material, and then forming a top electrode material above the CNT material. Some researchers have speculated that the bottom electrode material may be altered during the CNT deposition process. As a result of such alteration, the yield of the resulting memory devices may suffer.

In accordance with some embodiments, a CNT MIM stack may be formed that includes a bottom electrode that includes titanium-nitride ("TiN"). In particular, in one exemplary embodiment, methods and apparatus form or include a CNT MIM bottom electrode that includes a titanium-rich Ti—N material layer. As used herein, "Ti-rich TiN" means a TiN material in which the titanium concentration is between about 50% Ti and about 95% Ti, more particularly between about 55% Ti and 75% Ti. The Ti-rich TiN material layer may encompass all or a part of the CNT MIM bottom electrode.

In another exemplary embodiment, methods and apparatus form or include a CNT MIM that includes titanium carbide ("TiC") contacts between the CNT material and the bottom electrode. For example, exemplary embodiments may form a CNT MIM by depositing CNT material on a Ti-rich bottom electrode, and subsequently performing an anneal at a temperature of about 700° C. for about 5 to about 30 seconds to form TiC contacts between the CNT material and the bottom electrode. Higher temperatures close to the TiC phase transformation, such as 800 to 900° C. can be used as well. As used herein, a "TiC contact" means a TiC material in which the carbon concentration is between about 1% C to about 60% C, more specifically between about 10% C to about 50% C.

For example, in a first embodiment, a CNT-based MIM stack is formed by forming a first conducting layer comprising a titanium nitride material having between about 50% Ti and about 95% titanium, forming a CNT material above the first conducting layer, forming a second conducting layer above the CNT material, and etching the first conducting layer, CNT material and second conducting layer to form the MIM stack.

Although not wanting to be bound by any particular theory, it is believed that using a Ti-rich bottom electrode may result in improved device yield and electrical performance. In embodiments in which Ti-rich TiN is employed, after CNT deposition and further processing, the CNT-to-bottom electrode contact may be composed of TixOyCzNv, where x+y+z+v=1, and any one or two of the following can be zero: y, z, v. In another approach, any one or two of the following can be zero: y, v. Additionally, it is believed that forming TiC contacts may result in improved and reproducible electrical contact between the CNT and the bottom electrode. The TiC can be initially formed with or without Ti-rich TiN material. The CNT element can be in contact with the Ti-rich TiN.

Exemplary Memory Cell

FIG. 1 is a schematic illustration of an exemplary memory cell 10. Memory cell 10 includes a reversible resistance switching element 12 coupled to a steering element 14. Reversible resistance switching element 12 includes a reversible resistivity switching material (not separately shown) having a resistivity that may be reversibly switched between two or more states.

For example, the reversible resistivity switching material of element 12 may be in an initial, low-resistivity state upon fabrication. Upon application of a first voltage and/or current, the material is switchable to a high-resistivity state. Application of a second voltage and/or current may return the reversible resistivity switching material to a low-resistivity state.

Alternatively, reversible resistance switching element 12 may be in an initial, high-resistance state upon fabrication that is reversibly switchable to a low-resistance state upon application of the appropriate voltage(s) and/or current(s). When used in a memory cell, one resistance state may represent a binary "0," whereas another resistance state may represent a binary "1", although more than two data/resistance states may be used.

Numerous reversible resistivity switching materials and operation of memory cells employing reversible resistance switching elements are described, for example, in U.S. patent application Ser. No. 11/125,939, filed May 9, 2005 and titled "Rewriteable Memory Cell Comprising A Diode And A Resistance Switching Material" (the "'939 Application"), published as US2006/0250836 on Nov. 9, 2006, which is hereby incorporated by reference herein in its entirety for all purposes.

Steering element 14 may include a thin film transistor, a diode, a metal-insulator-metal tunneling current device, or another similar steering element that exhibits non-ohmic conduction by selectively limiting the voltage across and/or the current flow through reversible resistance switching element 12. In this manner, memory cell 10 may be used as part of a two or three dimensional memory array and data may be written to and/or read from memory cell 10 without affecting the state of other memory cells in the array.

In one approach. a CMOS transistor is used as a steering element.

Exemplary embodiments of memory cell 10, reversible resistance switching element 12 and steering element 14 are described below with reference to FIGS. 2A-2D and FIG. 3.

Exemplary Embodiments of Memory Cells and Memory Arrays

Figure 2A:
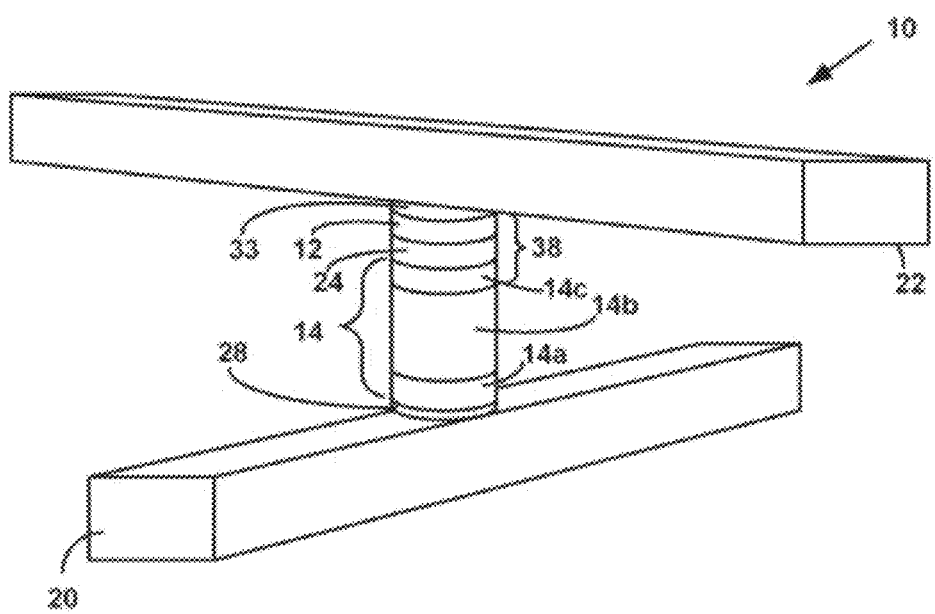
FIG. 2A is a simplified perspective view of an exemplary memory.

FIG. 2A is a simplified perspective view of an exemplary embodiment of a memory cell 10 that includes a steering element 14 and a carbon-based reversible resistance switching element 12. Reversible resistance switching element 12 is coupled in series with steering element 14 between a first conductor 20 and a second conductor 22.

In some embodiments, a first conducting layer 24 may be formed between reversible resistance switching element 12 and steering element 14, a barrier layer 28 may be formed between steering element 14 and first conductor 20, and a second conducting layer 33 may be formed between reversible resistance switching element 12 and second conductor 22. First conducting layer 24, second conducting layer 33, and barrier layer 28 each may include titanium, titanium nitride ("TiN"), tantalum, tantalum nitride ("TaN"), tungsten, tungsten nitride ("WN"), molybdenum or another similar material. In accordance with one embodiment, conducting layer 24 includes a Ti-rich TiN material in contact with carbon-based reversible resistance switching element 12.

First conducting layer 24, reversible resistance switching element 12 and second conducting layer 33 may form a MIM stack 38 in series with steering element 14, with first conducting layer 24 forming a bottom electrode, and second conducting layer 33 forming a top electrode of MIM stack 38. One of the top and bottom electrodes can be a first electrode and the other of the top and bottom electrodes can be a second electrode. For simplicity, first conducting layer 24 and second conducting layer 33 will be referred to in the remaining discussion as "bottom electrode 24" and "top electrode 33," respectively. In some embodiments, reversible resistance switching element 12 and/or MIM stack 38 may be positioned below steering element 14.

As discussed above, steering element 14 may include a thin film transistor, a diode, a metal-insulator-metal tunneling current device, or another similar steering element that exhibits non-ohmic conduction by selectively limiting the voltage across and/or the current flow through reversible resistance switching element 12. In the example of FIG. 2A, steering element 14 is a diode. Accordingly, steering element 14 is sometimes referred to herein as "diode 14."

Diode 14 may include any suitable diode such as a vertical polycrystalline p-n or p-i-n diode, whether upward pointing with an n-region above a p-region of the diode or downward pointing with a p-region above an n-region of the diode. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed. Exemplary embodiments of diode 14 are described below with reference to FIG. 3.

Reversible resistance switching element 12 may include a carbon-based material (not separately shown) having a resistivity that may be reversibly switched between two or more states. For example, reversible resistance switching element 12 may include a CNT material or other similar carbon-based material. For simplicity, reversible resistance switching element 12 will be referred to in the remaining discussion as "CNT element 12."

First conductor 20 and/or second conductor 22 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 20 and 22, respectively, are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with the first conductor 20 and/or second conductor 22 to improve device performance and/or aid in device fabrication.

Figure 2B:
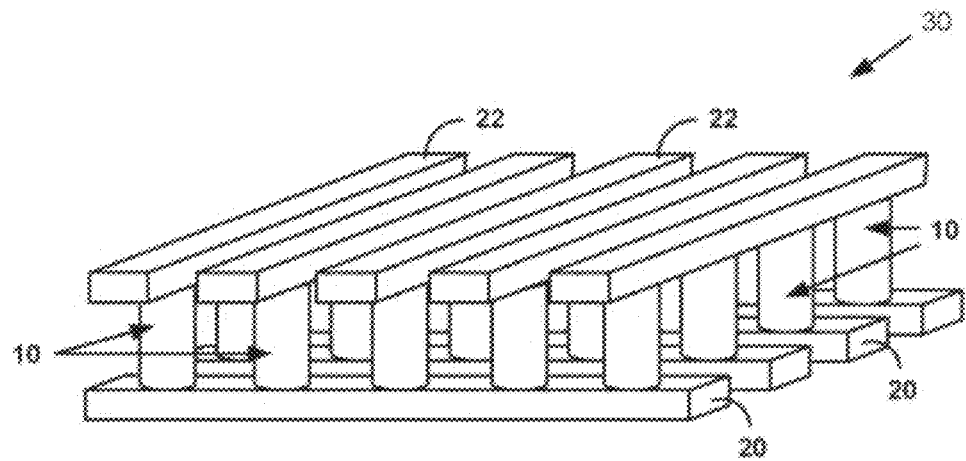
FIG. 2B is a simplified perspective view of a portion of a first exemplary memory level formed from a plurality of the memory cells of FIG. 2A.

FIG. 2B is a simplified perspective view of a portion of a first memory level 30 formed from a plurality of memory cells 10, such as memory cell 10 of FIG. 2A. For simplicity, MIM 38, diode 14, and barrier layer 28 are not separately shown. Memory level 30 is a "cross-point" array including a plurality of bit lines (second conductors 22) and word lines (first conductors 20) to which multiple memory cells are coupled (as shown). Other memory array configurations may be used, as may multiple levels of memory.

Figure 2C:
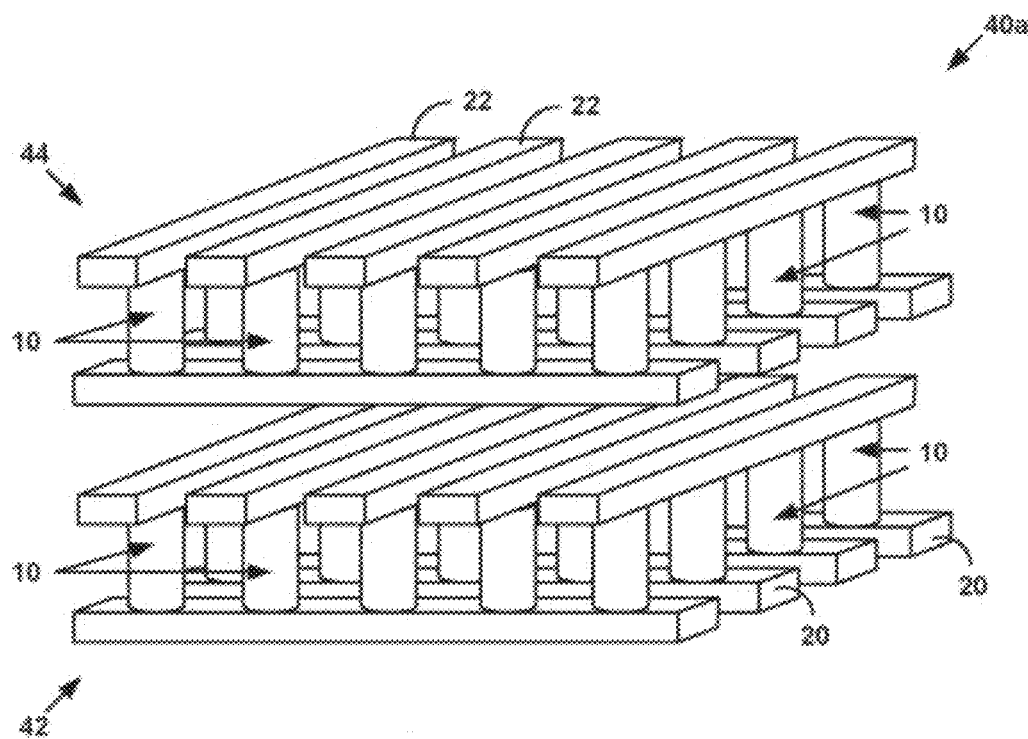
FIG. 2C is a simplified perspective view of a portion of a first exemplary three-dimensional memory array.

For example, FIG. 2C is a simplified perspective view of a portion of a monolithic three dimensional array 40a that includes a first memory level 42 positioned below a second memory level 44. Memory levels 42 and 44 each include a plurality of memory cells 10 in a cross-point array. Persons of ordinary skill in the art will understand that additional layers (e.g., an interlevel dielectric) may be present between the first and second memory levels 42 and 44, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

In some embodiments, the memory levels may be formed as described in U.S. Pat. No. 6,952,030, titled "High-Density Three-Dimensional Memory Cell" which is hereby incorporated by reference herein in its entirety for all purposes. For instance, the upper conductors of a first memory level may be used as the lower conductors of a second memory level that is positioned above the first memory level as shown in the alternative exemplary three dimensional memory array 40b illustrated in FIG. 2D.

In such embodiments, the diodes on adjacent memory levels preferably point in opposite directions as described in U.S. patent application Ser. No. 11/692,151, filed Mar. 27, 2007, and titled "Large Array Of Upward Pointing P-I-N Diodes Having Large And Uniform Current" (hereinafter "the '151 Application"), issued as U.S. Pat. No. 7,767,499 on Aug. 3, 2010, which is hereby incorporated by reference herein in its entirety for all purposes.

Figure 2D:
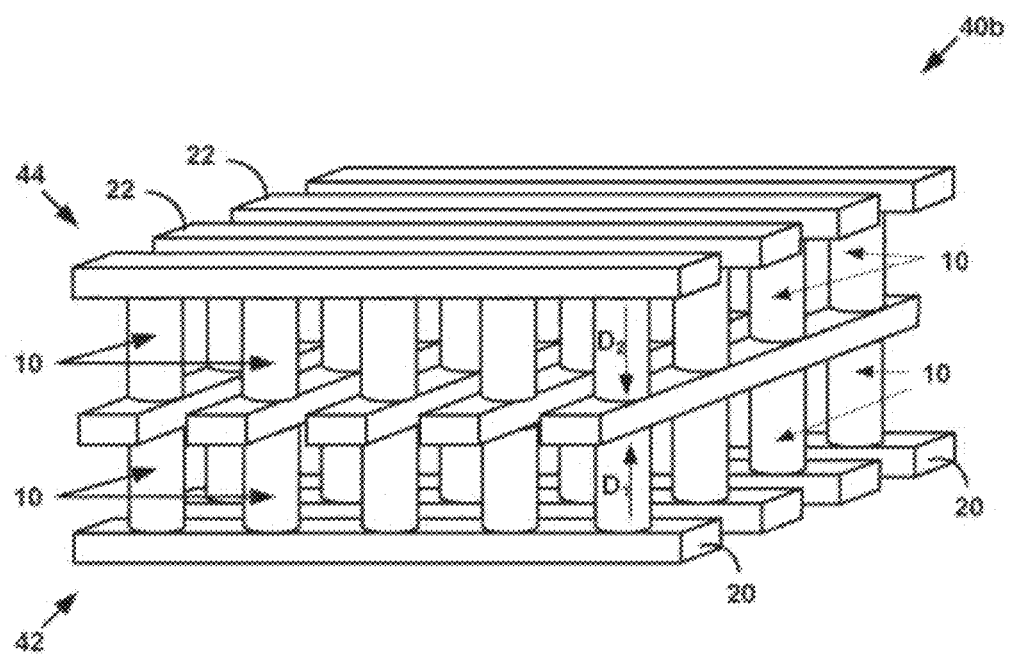
FIG. 2D is a simplified perspective view of a portion of a second exemplary three-dimensional memory array.

For example, as shown in FIG. 2D, the diodes of the first memory level 42 may be upward pointing diodes as indicated by arrow D1 (e.g., with p regions at the bottom of the diodes), whereas the diodes of the second memory level 44 may be downward pointing diodes as indicated by arrow D2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

In some embodiments, a resistivity of the CNT material used to form CNT element 12 is at least $1 \times 10^1$ ohm cm when CNT element 12 is in an ON-state, whereas a resistivity of the CNT material used to form CNT element 12 is at least $1 \times 10^3$ ohm-cm when CNT element 12 is in an OFF-state. Other resistivities may be used.

Figure 2E:
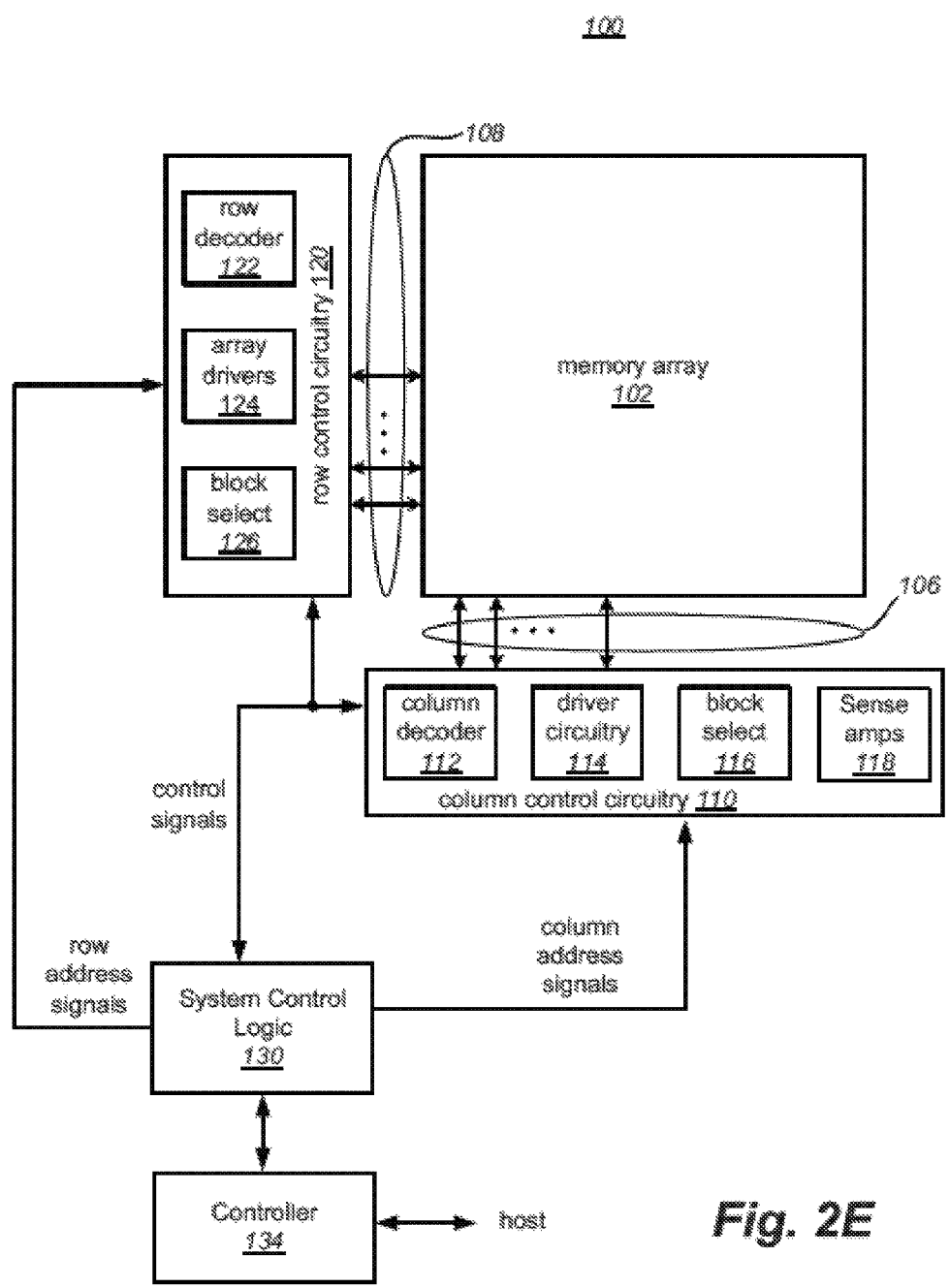
FIG. 2E is a block diagram of one embodiment of a memory system.

FIG. 2E is a block diagram that depicts one example of a memory system 100 that can implement the technology described herein. Memory system 100 includes a memory array 102, which can be a two or three dimensional array of memory cells. In one embodiment, memory array 102 is a monolithic three dimensional memory array. The array terminal lines of memory array 102 include the various layer(s) of word lines organized as rows, and the various layer(s) of bit lines organized as columns. However, other orientations can also be implemented.

Memory system 100 includes row control circuitry 120, whose outputs 108 are connected to respective word lines of the memory array 102. For purposes of this document, a connection can be a direct connection or indirect connection (e.g., via one or more other components). Row control circuitry 120 receives a group of M row address signals and one or more various control signals from System Control Logic circuit 130, and typically may include such circuits as row decoders 122, array drivers 124, and block select circuitry 126 for both read and programming operations.

Memory system 100 also includes column control circuitry 110 whose input/outputs 106 are connected to respective bit lines of the memory array 102. Column control circuitry 110 receives a group of N column address signals and one or more various control signals from System Control Logic 130, and typically may include such circuits as column decoders 112, driver circuitry 114, block select circuitry 116, and sense amplifiers 118. In one embodiment, sense amplifiers 118 provide signals to the bit lines and sense signals on the bit lines. Various sense amplifiers known in the art can be used herein.

System control logic 130 receives data and commands from controller 134 and provides output data to controller 134. Controller 134 communicates with a host. System control logic 130 may include one or more state machines, registers and other control logic for controlling the operation of memory system 100. In other embodiments, system control logic 130 receives data and commands directly from a host and provides output data to that host, because system control logic 130 includes the functionality of a controller.

In one embodiment, system control logic 130, column control circuitry 110, row control circuitry 120 and memory array 102 are formed on the same integrated circuit. For example, system control logic 130, column control circuitry 110 and row control circuitry 120 can be formed on the surface of a substrate and memory array 102 is a monolithic three-dimensional memory array formed above the substrate (and, therefore, above all or a portion of system control logic 130, column control circuitry 110 and row control circuitry 120). In some cases, a portion of the control circuitry can be formed on the same layers as some of the memory array. More information about suitable embodiments like that of FIG. 2E can be found in the following United States patents that are incorporated herein by reference in their entirety: U.S. Pat. No. 6,879,505; U.S. Pat. No. 7,286,439; U.S. Pat. No. 6,856,572; and U.S. Pat. No. 7,359,279. Controller 134 can be on the same substrate as or a different substrate than the other components depicted in FIG. 2E. Controller 134, system control logic 130, column control circuitry 110, column decoder 112, driver circuitry 114, block select 116, sense amplifiers 118, row control circuitry 120, row decoder 122, array drivers 124 and/or block select 126, alone or in any combination, can be thought of as one or more control circuits.

Figure 3:
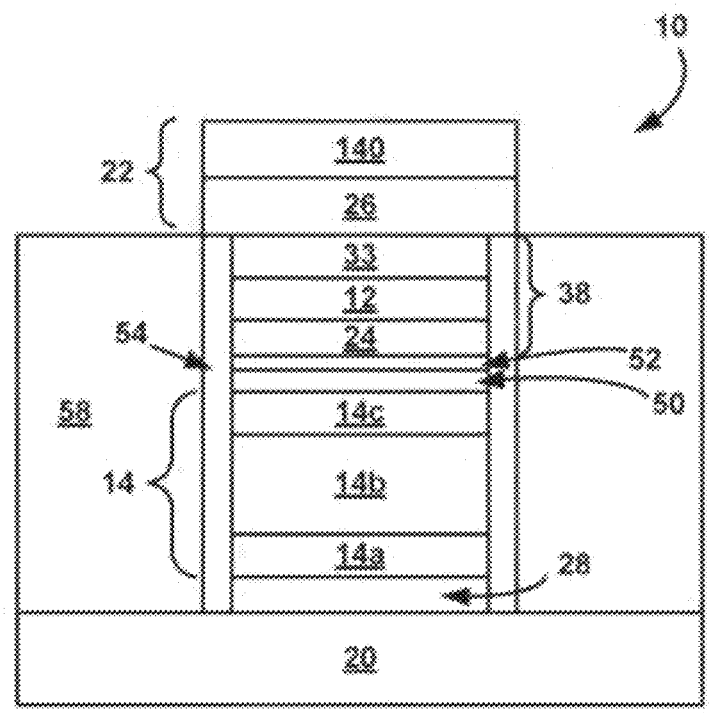
FIG. 3 is a cross-sectional view of an exemplary embodiment of a memory cell.

FIG. 3 is a cross-sectional view of an exemplary embodiment of memory cell 10 of FIG. 1. In particular, FIG. 3 shows an exemplary memory cell 10 which includes CNT element 12, diode 14, and first and second conductors 20 and 22, respectively. Memory cell 10 may also include bottom electrode 24, barrier layer 28, top electrode 33, a silicide layer 50, a silicide-forming metal layer 52, and dielectric layer 58, as well as adhesion layers, antireflective coating layers and/or the like (not shown) which may be used with first and/or second conductors 20 and 22, respectively, to improve device performance and/or facilitate device fabrication. In some embodiments, a sidewall liner 54 may be used to separate selected layers of memory cell 10 from dielectric layer 58.

In FIG. 3, diode 14 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, diode 14 may be formed from a polycrystalline semiconductor material such as polysilicon, a polycrystalline silicon-germanium alloy, polygermanium or any other suitable material. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed.

In some embodiments, a thin germanium and/or silicon-germanium alloy layer (not shown) may be formed on n+ polysilicon region 14a to prevent and/or reduce dopant migration from n+ polysilicon region 14a into intrinsic region 14b. Use of such a layer is described, for example, in U.S. patent application Ser. No. 11/298,331, filed Dec. 9, 2005 and titled "Deposited Semiconductor Structure To Minimize N-Type Dopant Diffusion And Method Of Making" (hereinafter "the '331 Application"), issued as U.S. Pat. No. 7,405,465 on Jul. 29, 2008, which is hereby incorporated by reference herein in its entirety for all purposes. In some embodiments, a few hundred angstroms or less of silicon-germanium alloy with about 10 at % or more of germanium may be employed.

Barrier layer 28, such as titanium, TiN, tantalum, TaN, tungsten, WN, molybdenum, etc., may be formed between the first conductor 20 and the n+ region 14a (e.g., to prevent and/or reduce migration of metal atoms into the polysilicon regions).

If diode 14 is fabricated from deposited silicon (e.g., amorphous or polycrystalline), a silicide layer 50 may be formed on diode 14 to place the deposited silicon in a low resistivity state, as fabricated. Such a low resistivity state allows for easier programming of memory cell 10 as a large voltage is not required to switch the deposited silicon to a low resistivity state.

For example, a silicide-forming metal layer 52 such as titanium or cobalt may be deposited on p+ polysilicon region 14c. During a subsequent anneal step (described below), silicide-forming metal layer 52 and the deposited silicon of diode 14 interact to form silicide layer 50, consuming all or a portion of the silicide-forming metal layer 52. In some embodiments, a nitride layer (not shown) may be formed at a top surface of silicide-forming metal layer 52. For example, if silicide-forming metal layer 52 is titanium, a TiN layer may be formed at a top surface of silicide-forming metal layer 52.

A rapid thermal anneal ("RTA") step may then be performed to form silicide regions by reaction of silicide-forming metal layer 52 with p+ region 14c. The RTA may be performed at about 540° C. for about 1 minute, and causes silicide-forming metal layer 52 and the deposited silicon of diode 14 to interact to form silicide layer 50, consuming all or a portion of the silicide-forming metal layer 52. An additional, higher temperature anneal (e.g., such as at about 750° C. as described below) may be used to crystallize the diode.

As described in U.S. Pat. No. 7,176,064, titled "Memory Cell Comprising A Semiconductor Junction Diode Crystallized Adjacent To A Silicide," which is hereby incorporated by reference herein in its entirety for all purposes, silicide-forming materials such as titanium and/or cobalt react with deposited silicon during annealing to form a silicide layer. The lattice spacings of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of the diode 14 during annealing). Lower resistivity silicon thereby is provided. Similar results may be achieved for silicon-germanium alloy and/or germanium diodes.

In embodiments in which a nitride layer was formed at a top surface of silicide-forming metal layer 52, following the RTA step, the nitride layer may be stripped using a wet chemistry. For example, if silicide-forming metal layer 52 includes a TiN top layer, a wet chemistry (e.g., ammonium, peroxide, water in a 1:1:1 ratio) may be used to strip any residual TiN. In some embodiments, the nitride layer formed at a top surface of silicide-forming metal layer 52 may remain, or may not be used at all.

Bottom electrode 24 is formed above metal-forming silicide layer 52. In some embodiments, bottom electrode 24 may have a thickness of about 10 to 2000 angstroms, although other thicknesses may be used. In some embodiments, bottom electrode 24 may be a TiN layer. For example, the present inventors have found that using a Ti-rich TiN bottom electrode 24 may significantly increase device yield. As described above, as used herein, Ti-rich TiN means a TiN material in which the titanium concentration is between about 50% Ti and about 95% Ti, more particularly between about 55% Ti and 75% Ti.

Persons of ordinary skill in the art will understand that bottom electrode 24 may entirely include Ti-rich TiN material, or only a portion of bottom electrode 24 may include Ti-rich TiN material. For example, bottom electrode 24 may include a layer a Ti-rich TiN material layer above a layer of TiN, tungsten, tungsten nitride, or other conductor material. The Ti-rich TiN layer may have a thickness of between about 2 angstroms to about 500 angstroms. In such instances, bottom electrode 24 is oriented so that the Ti-rich TiN layer contacts CNT element 12.

Ti-rich TiN bottom electrode 24 may be formed by any suitable process, such as physical vapor deposition ("PVD"), chemical vapor deposition ("CVD"), plasma-enhanced CVD ("PECVD"), sputter deposition, atomic layer deposition ("ALD"), or other similar process.

Table 1, below, includes exemplary Ti-rich TiN PVD deposition process conditions:

TABLE 1

EXEMPLARY TI-RICH TIN PVD DEPOSITION PARAMETERS

| PROCESS PARAMETER | EXEMPLARY RANGE | PREFERRED RANGE |
|---|---|---|
| Argon Flow Rate (sccm) | 20-40 | 20-30 |
| Ar With Dilute $H_2$ (<10%) Flow Rate (sccm) | 0-30 | 0-10 |
| Nitrogen Flow Rate (sccm) | 5-65 | 10-50 |
| Pressure (milliTorr) | 1-5000 | 1800-2400 |
| Power (Watts) | 10-9000 | 2000-9000 |
| Power Ramp Rate (Watts/sec) | 10-5000 | 2000-5000 |
| Process Temperature (° C.) | 100-600 | 200-350 |
| Deposition Time (sec) | 5-200 | 10-150 |

Other flow rates, pressures, powers, power ramp rates, process temperatures and/or deposition times may be used.

For example, Table 2, below, includes alternative exemplary Ti-rich TiN PVD deposition process conditions:

TABLE 2

EXEMPLARY TI-RICH TIN PVD DEPOSITION PARAMETERS

| PROCESS PARAMETER | EXEMPLARY RANGE | PREFERRED RANGE |
|---|---|---|
| Argon Flow Rate (sccm) | 10-100 | 10-70 |
| Ar With Dilute $H_2$ (<10%) Flow Rate (sccm) | 0-30 | 1-10 |
| Nitrogen Flow Rate (sccm) | 5-25 | 5-15 |
| Pressure (milliTorr) | 1-5000 | 1-100 |
| Power (Watts) | 10-9000 | 2000-6000 |
| Power Ramp Rate (Watts/sec) | 10-5000 | 1000-4000 |
| Process Temperature (° C.) | 15-30 | 20-25 |
| Deposition Time (sec) | 1-400 | 1-30 |

Other flow rates, pressures, powers, power ramp rates, process temperatures and/or deposition times may be used.

Exemplary deposition chambers include the ENDURA® 2 tool available from APPLIED MATERIALS, INC. of Santa Clara, Calif. Other processing tools may be used. In some embodiments, a buffer chamber pressure of about $1-2 \times 10^{-7}$ Torr and a transfer chamber pressure of about $2-5 \times 10^{-8}$ Torr may be used. The deposition chamber may be stabilized for about 250-350 seconds with about 60-80 sccm Ar, 60-70 sccm N2, and about 5-10 sccm of Ar with dilute H2 at about 1800-2400 milliTorr. In some embodiments, it may take about 2-5 seconds to strike the target. Other buffer chamber pressures, transfer chamber pressures and/or deposition chamber stabilization parameters may be used.

CNT element 12 is formed above Ti-rich TiN bottom electrode 24 by depositing or otherwise forming a layer of CNT material. CNT material may be formed over Ti-rich TiN bottom electrode 24 using any suitable CNT formation process. One technique involves spray- or spin-coating a carbon nanotube suspension over Ti-rich TiN bottom electrode 24, thereby creating a random CNT material. Another technique involves growing carbon nanotubes from a seed anchored to the substrate by CVD, PECVD or the like.

Discussions of various CNT deposition techniques are found in related applications, hereby incorporated by reference herein in their entireties, The previously incorporated US2009/0168491;" U.S. patent application Ser. No. 11/968, 156, "Memory Cell That Employs A Selectively Fabricated Carbon Nano-Tube Reversible Resistance-Switching Element Formed Over A Bottom Conductor And Methods Of Forming The Same, published as US2009/0166609 on Jul. 2, 2009;" and U.S. patent application Ser. No. 11/968,159, "Memory Cell With Planarized Carbon Nanotube Layer And Methods Of Forming The Same," published as US2009/0166610.

Any suitable thickness may be employed for the CNT material of CNT element 12. In one embodiment, a CNT material thickness of about 100 to about 1000, and more preferably about 400-600 angstroms, may be used.

An anneal step may then be performed to form TiC contacts between CNT element 12 and Ti-rich TiN bottom electrode 24 by reaction of CNT element 12 with Ti-rich TiN bottom electrode 24. The anneal may be performed at about 700° C. for about 5 to about 30 seconds, and may cause CNT element 12 and Ti-rich TiN bottom electrode 24 to interact to form TiC contacts between CNT element 12 and Ti-rich TiN bottom electrode 24. Persons of ordinary sill in the art will understand that higher temperatures close to the TiC phase transformation, such as 800 to 900° C. can be used as well.

Because all of the CNT material in CNT element 12 does not make contact with Ti-rich TiN bottom electrode 24, persons of ordinary skill in the art will understand that there may be a localized variance in composition. Thus, as described above, as used herein, "TiC contact" means a TiC material in which the carbon concentration is between about 1% C to about 60% C, more specifically between about 10% C to about 50% C.

Persons of ordinary skill in the art will understand that a subsequent, higher temperature anneal (e.g., such as at about 750° C. as described below) alternatively may be used to form TiC contacts between CNT element 12 and Ti-rich TiN bottom electrode 24.

Top electrode 33, such as one or more of Ti (titanium), TiN (titanium nitride), Ta (tantalum), TaN (tantalum nitride), W (tungsten), WN (tungsten nitride), Mo (molybdenum), etc., is formed above CNT element 12. In some embodiments, top electrode 33 may be TiN with a thickness of about 100 to 2000 angstroms, although other materials and/or thicknesses may be used.

Memory cell 10 also includes a sidewall liner 54 formed along the sides of the memory cell layers. Liner 54 may be formed using a dielectric material, such as boron nitride, silicon nitride, silicon oxynitride, low K dielectrics, etc. Exemplary low K dielectrics include carbon doped oxides, silicon carbon layers, or the like.

In some embodiments, the CNT element 12 may be positioned below diode 14.

Exemplary Fabrication Processes for Memory Cells

Referring now to FIGS. 4A-4G, a first exemplary method of forming a memory level. In particular, FIGS. 4A-4G illustrate an exemplary method of forming a memory level including memory cells 10 of FIG. 3. As will be described below, the first memory level includes a plurality of memory cells that each include a steering element and a carbon-based (e.g., CNT) reversible resistance switching element coupled to the steering element. Additional memory levels may be fabricated above the first memory level (as described previously with reference to FIGS. 2C-2D).

Figure 4A:
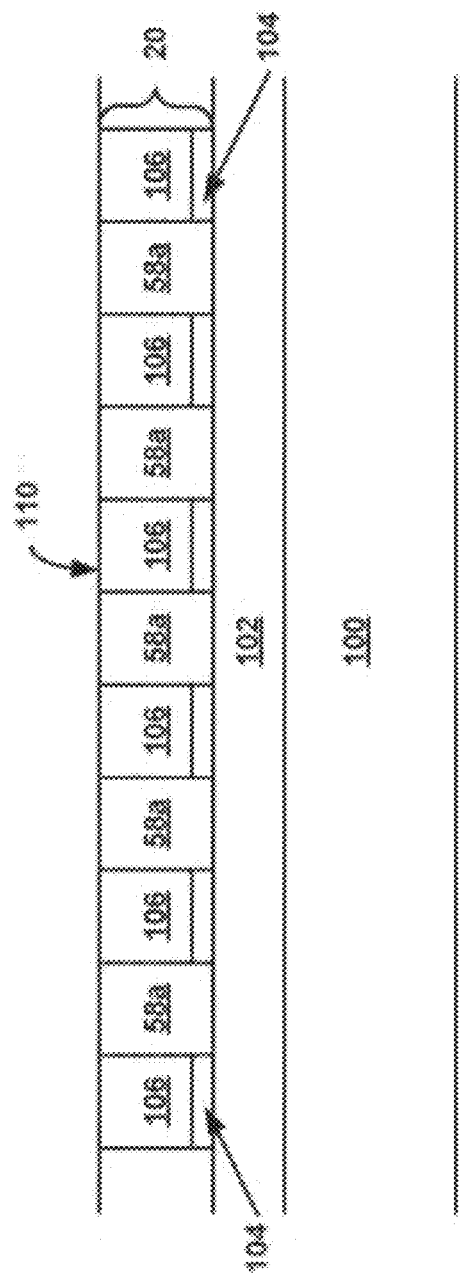

With reference to FIG. 4A, substrate 100 is shown as having already undergone several processing steps. Substrate 100 may be any suitable substrate such as a silicon, germanium, silicon-germanium, undoped, doped, bulk, silicon-on-insulator ("SOI") or other substrate with or without additional circuitry. For example, substrate 100 may include one or more n-well or p-well regions (not shown).

Isolation layer 102 is formed above substrate 100. In some embodiments, isolation layer 102 may be a layer of silicon dioxide, silicon nitride, silicon oxynitride or any other suitable insulating layer.

Following formation of isolation layer 102, an adhesion layer 104 is formed over isolation layer 102 (e.g., by physical vapor deposition or another method). For example, adhesion layer 104 may be about 20 to about 500 angstroms, and preferably about 100 angstroms, of titanium nitride or another suitable adhesion layer such as tantalum nitride, tungsten nitride, tungsten, molybdenum, combinations of one or more adhesion layers, or the like. Other adhesion layer materials and/or thicknesses may be employed. In some embodiments, adhesion layer 104 may be optional.

After formation of adhesion layer 104, a conductive layer 106 is deposited over adhesion layer 104. Conductive layer 106 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive layer 106 may comprise about 200 to about 2500 angstroms of tungsten. Other conductive layer materials and/or thicknesses may be used.

Following formation of conductive layer 106, adhesion layer 104 and conductive layer 106 are patterned and etched. For example, adhesion layer 104 and conductive layer 106 may be patterned and etched using conventional lithography techniques, with a soft or hard mask, and wet or dry etch processing. In at least one embodiment, adhesion layer 104 and conductive layer 106 are patterned and etched to form substantially parallel, substantially co-planar first conductors 20. Exemplary widths for first conductors 20 and/or spacings between first conductors 20 range from about 200 to about 2500 angstroms, although other conductor widths and/or spacings may be used.

After first conductors 20 have been formed, a dielectric layer 58a is formed over substrate 100 to fill the voids between first conductors 20. For example, approximately 3000-7000 angstroms of silicon dioxide may be deposited on the substrate 100 and planarized using chemical mechanical polishing or an etchback process to form a planar surface 110. Planar surface 110 includes exposed top surfaces of first conductors 20 separated by dielectric material (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

In other embodiments, first conductors 20 may be formed using a damascene process in which dielectric layer 58a is formed, patterned and etched to create openings or voids for first conductors 20. The openings or voids then may be filled with adhesion layer 104 and conductive layer 106 (and/or a conductive seed, conductive fill and/or barrier layer if needed). Adhesion layer 104 and conductive layer 106 then may be planarized to form planar surface 110. In such an embodiment, adhesion layer 104 will line the bottom and sidewalls of each opening or void.

Figure 4B:
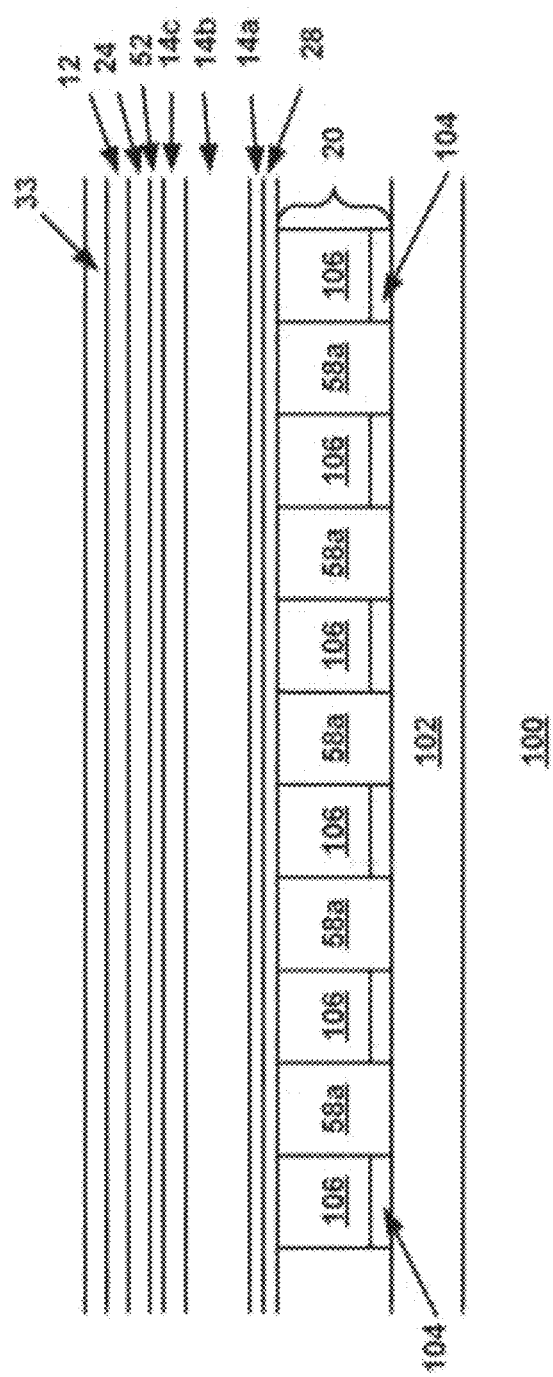

Following planarization, the diode structures of each memory cell are formed. With reference to FIG. 4B, a barrier layer 28 is formed over planarized top surface 110 of substrate 100. In some embodiments, barrier layer 28 may be about 20 to about 500 angstroms, and preferably about 100 angstroms, of titanium nitride or another suitable barrier layer such as tantalum nitride, tungsten nitride, tungsten, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 28, deposition of the semiconductor material used to form the diode of each memory cell begins (e.g., diode 14 in FIGS. 1 and 3). Each diode may be a vertical p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

With reference to FIG. 4B, following formation of barrier layer 28, a heavily doped n+ silicon layer 14a is deposited on barrier layer 28. In some embodiments, n+ silicon layer 14a is in an amorphous state as deposited. In other embodiments, n+ silicon layer 14a is in a polycrystalline state as deposited. CVD or another suitable process may be employed to deposit n+ silicon layer 14a. In at least one embodiment, n+ silicon layer 14a may be formed, for example, from about 100 to about 1000 angstroms, preferably about 100 angstroms, of phosphorus or arsenic doped silicon having a doping concentration of about $10^{21}$ cm-3. Other layer thicknesses, doping types and/or doping concentrations may be used. N+ silicon layer 14a may be doped in situ, for example, by flowing a donor gas during deposition. Other doping methods may be used (e.g., implantation).

After deposition of n+ silicon layer 14a, a lightly doped, intrinsic and/or unintentionally doped silicon layer 14b may be formed over n+ silicon layer 14a. In some embodiments, intrinsic silicon layer 14b may be in an amorphous state as deposited. In other embodiments, intrinsic silicon layer 14b may be in a polycrystalline state as deposited. CVD or another suitable deposition method may be employed to deposit intrinsic silicon layer 14b. In at least one embodiment, intrinsic silicon layer 14b may be about 300 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on n+ silicon layer 14a prior to depositing intrinsic silicon layer 14b to prevent and/or reduce dopant migration from n+ silicon layer 14a into intrinsic silicon layer 14b (as described in the '331 Application).

P-type silicon may be either deposited and doped by ion implantation or may be doped in situ during deposition to form a p+ silicon layer 14c. For example, a blanket p+ implant may be employed to implant boron a predetermined depth within intrinsic silicon layer 14b. Exemplary implantable molecular ions include BF2, BF3, B and the like. In some embodiments, an implant dose of about 1-5×1015 ions/cm2 may be employed. Other implant species and/or doses may be used. Further, in some embodiments, a diffusion process may be employed. In at least one embodiment, the resultant p+ silicon layer 14c has a thickness of about 100-700 angstroms, although other p+ silicon layer sizes may be used.

Following formation of p+ silicon layer 14c, a silicide-forming metal layer 52 is deposited over p+ silicon layer 14c. Exemplary silicide-forming metals include sputter or otherwise deposited titanium or cobalt. In some embodiments, silicide-forming metal layer 52 has a thickness of about 10 to about 200 angstroms, preferably about 20 to about 50 angstroms and more preferably about 20 angstroms. Other silicide-forming metal layer materials and/or thicknesses may be used. A nitride layer (not shown) may be formed at the top of silicide-forming metal layer 52.

Following formation of silicide-forming metal layer 52, an RTA step may be performed at about 540° C. for about one minute to form silicide layer 50 (FIG. 3), consuming all or a portion of the silicide-forming metal layer 52. Following the RTA step, any residual nitride layer from silicide-forming metal layer 52 may be stripped using a wet chemistry, as described above. Other annealing conditions may be used.

Following the RTA step and the nitride strip step, bottom electrode 24 is formed above silicide layer 50. In some embodiments, Ti-rich TiN bottom electrode 24 may be about 20 to about 500 angstroms, and preferably about 100 angstroms. Some or all of the bottom electrode may be Ti-rich TiN. For example, in some embodiments, bottom electrode 24 may have a thickness of about 10 angstroms to about 2000 angstroms, with the Ti-rich TiN portion having a thickness of about 2 angstroms to about 500 angstroms.

As described above, Ti-rich TiN bottom electrode 24 may be formed by PVD, CVD, PECVD, sputter deposition, ALD, or other similar process. Exemplary PVD processes for forming Ti-rich TiN bottom electrode 24 are listed above in Table 1 and Table 2. Persons of ordinary skill in the art will understand that other processes may be used.

CNT element 12 is formed above Ti-rich TiN bottom electrode 24. CNT material may be deposited by various techniques. One technique involves spray- or spin-coating a carbon nanotube suspension, thereby creating a random CNT material. Another technique involves growing carbon nanotubes from a seed anchored to the substrate by CVD, PECVD or the like. Discussions of various CNT deposition techniques are found in previously incorporated US2009/0168491 on Jul. 2, 2009;" the previously incorporated US2009/0166609; and US2009/0166610.

Any suitable thickness may be employed for the CNT material of CNT element 12. In one embodiment, a CNT material thickness of about 100 to about 1000, and more preferably about 400-600 angstroms, may be used.

Above CNT element 12, top electrode 33 is formed. Top electrode 33 may be about 20 to about 500 angstroms, and preferably about 100 angstroms, of titanium nitride or another suitable barrier layer such as tantalum nitride, tungsten nitride, tungsten, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed. For example, in some embodiments, the top electrode 33 may be TiN with a thickness of about 100 to 2000 angstroms. In one approach, the TiN is stoichiometric (not Ti-rich).

In at least one embodiment, top electrode 33 may be deposited without a pre-clean or pre-sputter step prior to deposition. Exemplary deposition process conditions are as set forth in Table 3.

TABLE 3

EXEMPLARY ADHESION/BARRIER LAYER DEPOSITION PARAMETERS

| PROCESS PARAMETER | EXEMPLARY RANGE | PREFERRED RANGE |
|---|---|---|
| Argon Flow Rate (sccm) | 20-40 | 20-30 |
| Ar With Dilute $H_2$ (<10%) Flow Rate (sccm) | 0-30 | 0-10 |
| Nitrogen Flow Rate (sccm) | 50-90 | 60-70 |
| Pressure (milliTorr) | 1-5000 | 1800-2400 |
| Power (Watts) | 10-9000 | 2000-9000 |
| Power Ramp Rate (Watts/sec) | 10-5000 | 2000-4000 |
| Process Temperature (° C.) | 100-600 | 200-350 |
| Deposition Time (sec) | 5-200 | 10-150 |

Other flow rates, pressures, powers, power ramp rates, process temperatures and/or deposition times may be used.

Exemplary deposition chambers include the ENDURA® 2 tool available from APPLIED MATERIALS, INC. of Santa Clara, Calif. Other processing tools may be used. In some embodiments, a buffer chamber pressure of about $1-2 \times 10^{-7}$ Torr and a transfer chamber pressure of about $2-5 \times 10^{-8}$ Torr may be used. The deposition chamber may be stabilized for about 250-350 seconds with about 60-80 sccm Ar, 60-70 sccm N2, and about 5-10 sccm of Ar with dilute H2 at about 1800-2400 milliTorr. In some embodiments, it may take about 2-5 seconds to strike the target. Other buffer chamber pressures, transfer chamber pressures and/or deposition chamber stabilization parameters may be used.

Figure 4C:
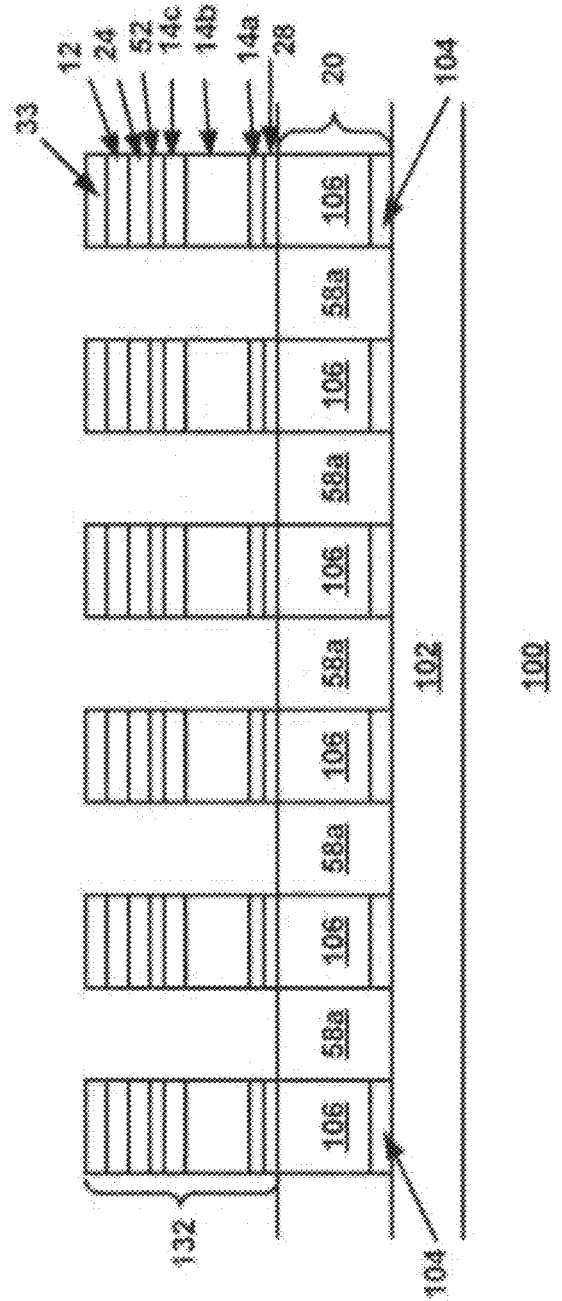

As shown in FIG. 4C, top electrode 33, CNT element 12, Ti-rich TiN bottom electrode 24, silicide-forming metal layer 52, diode layers 14a-14c, and barrier layer 28 are patterned and etched to form pillars 132. Pillars 132 may be formed above corresponding conductors 20 and have substantially the same width as conductors 20, for example, although other widths may be used. Some misalignment may be tolerated. The memory cell layers may be patterned and etched in a single pattern/etch procedure or using separate pattern/etch steps. In at least one embodiment, top electrode 33, CNT element 12 and Ti-rich TiN bottom electrode 24 are etched together to form MIM stack 38 (FIG. 3).

For example, photoresist may be deposited, patterned using standard photolithography techniques, layers 28, 14a-14c, 52, 24, 12, and 33 may be etched, and then the photoresist may be removed. Alternatively, a hard mask of some other material, for example silicon dioxide, may be formed on top of top electrode 33, with bottom antireflective coating ("BARC") on top, then patterned and etched. Similarly, dielectric antireflective coating ("DARC") may be used as a hard mask. In some embodiments, one or more additional metal layers may be formed above the CNT element 12 and diode 14 and used as a metal hard mask that remains part of the pillars 132. Use of metal hard masks is described, for example, in U.S. patent application Ser. No. 11/444,936, filed May 13, 2006 and titled "Conductive Hard Mask To Protect Patterned Features During Trench Etch" (hereinafter "the '936 Application"), issued as U.S. Pat. No. 7,575,984 on Aug. 18, 2009, which is hereby incorporated by reference herein in its entirety for all purposes.

Pillars 132 may be formed using any suitable masking and etching process. For example, layers 28, 14a-14c, 52, 24, 12, and 33 may be patterned with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

In at least some embodiments, a technique for etching CNT material using BC13 and C12 chemistries may be employed. For example, U.S. patent application Ser. No. 12/421,803, filed Apr. 10, 2009, titled "Methods For Etching Carbon Nano-Tube Films For Use In Non-Volatile Memories," published as US2009/0278112 on Nov. 12, 2009, which is hereby incorporated by reference herein in its entirety for all purposes, describes techniques for etching CNT material using BC13 and C12 chemistries. In other embodiments, a directional, oxygen-based etch may be employed such as is described in U.S. Provisional Patent Application Ser. No. 61/225,487, filed Jul. 14, 2009, which is hereby incorporated by reference herein in its entirety for all purposes. Any other suitable etch chemistries and/or techniques may be used.

In some embodiments, after etching, pillars 132 may be cleaned using a dilute hydrofluoric/sulfuric acid clean. Such cleaning, whether or not PR ashing is performed before etching, may be performed in any suitable cleaning tool, such as a Raider tool, available from Semitool of Kalispell, Mont. Exemplary post-etch cleaning may include using ultra-dilute sulfuric acid (e.g., about 1.5-1.8 wt %) for about 60 seconds and/or ultra-dilute hydrofluoric ("HF") acid (e.g., about 0.4-0.6 wt %) for 60 seconds. Megasonics (a type of acoustic cleaning) may or may not be used. Other clean chemistries, times and/or techniques may be employed.

A dielectric liner 54 is deposited conformally over pillars 132, as illustrated in FIG. 4D. In at least one embodiment, dielectric liner 54 may be formed with an oxygen-poor deposition chemistry (e.g., without a high oxygen plasma component) to protect the material of the CNT element 12 during a subsequent deposition of an oxygen-rich gap-fill dielectric 58b (e.g., SiO2) (not shown in FIG. 4D). For instance, dielectric sidewall liner 54 may comprise about 200 to about 500 angstroms of silicon nitride. However, the structure optionally may comprise other layer thicknesses and/or other materials, such as SixCyNz and SixOyNz (with low O content), etc., where x, y and z are non-zero numbers resulting in stable compounds. Persons of ordinary skill in the art will understand that other dielectric materials may be used to form dielectric liner 54.

In one exemplary embodiment, a SiN dielectric liner 54 may be formed using the process parameters listed in Table 4. Liner film thickness scales linearly with time. Other powers, temperatures, pressures, thicknesses and/or flow rates may be used.

TABLE 4

PECVD SiN LINER PROCESS PARAMETERS

| PROCESS PARAMETER | EXEMPLARY RANGE | PREFERRED RANGE |
| --- | --- | --- |
| SiH$_4$ Flow Rate (sccm) | 0.1-2.0 | 0.4-0.7 |
| NH$_3$ Flow Rate (sccm) | 2-10 | 3-5 |
| N$_2$ Flow Rate (sccm) | 0.3-4 | 1.2-1.8 |
| Temperature (° C.) | 300-500 | 350-450 |
| Low Frequency Bias (kW) | 0-1 | 0.4-0.6 |
| High Frequency Bias (kW) | 0-1 | 0.4-0.6 |
| Thickness (Angstroms) | 200-500 | 280-330 |

Figure 4E:
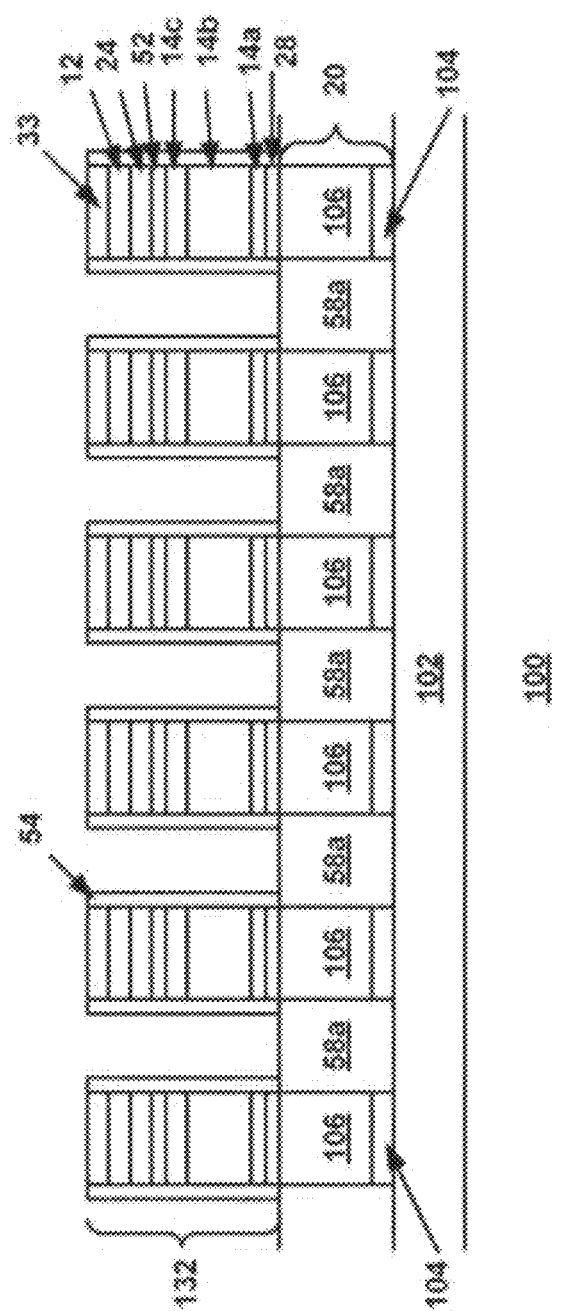
Figure 4F:
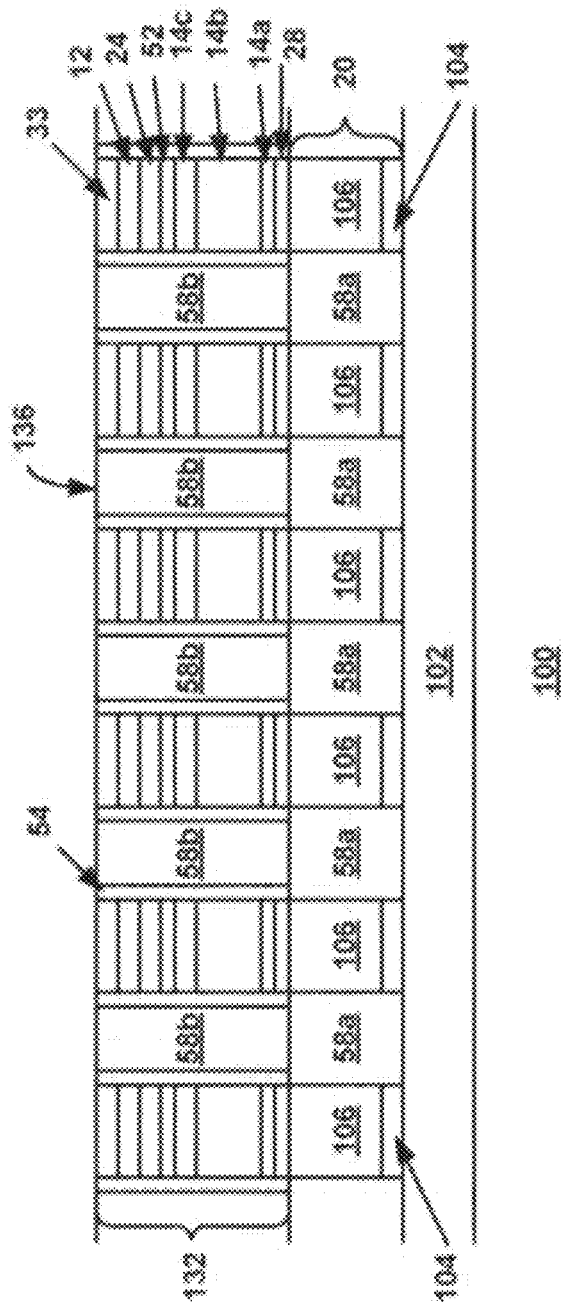

With reference to FIG. 4E, an anisotropic etch is used to remove lateral portions of liner 54, leaving only sidewall portions of liner 54 on pillars 132. For example, a sputter etch or other suitable process may be used to anisotropically etch liner 54.

A dielectric layer 58b is deposited over pillars 132 to fill the voids between pillars 132. For example, approximately 2000-7000 angstroms of silicon dioxide may be deposited and planarized using chemical mechanical polishing or an etch-back process to form a planar surface 136, resulting in the structure illustrated in FIG. 4F. Planar surface 136 includes exposed top surfaces of pillars 132 separated by dielectric material 58b (as shown). Other dielectric materials such as silicon nitride, silicon oxynitride, low K dielectrics, etc., and/or other dielectric layer thicknesses may be used.

Figure 4G:
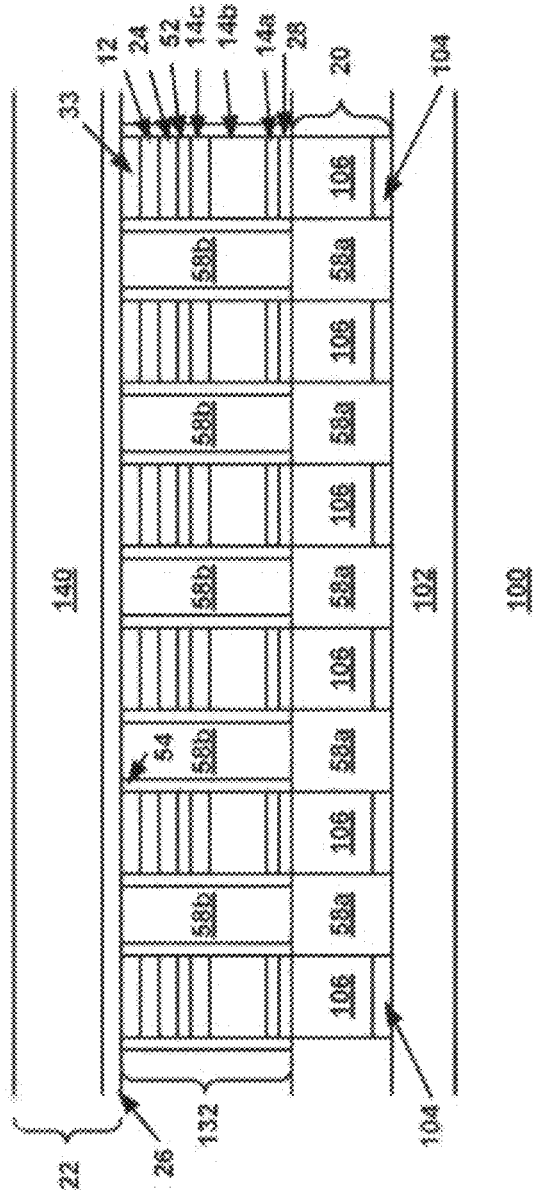

With reference to FIG. 4G, second conductors 22 may be formed above pillars 132 in a manner similar to the formation of first conductors 20. For example, in some embodiments, one or more barrier layers and/or adhesion layers 26 may be deposited over pillars 132 prior to deposition of a conductive layer 140 used to form second conductors 22.

Conductive layer 140 may be formed from any suitable conductive material such as tungsten, another suitable metal, heavily doped semiconductor material, a conductive silicide, a conductive silicide-germanide, a conductive germanide, or the like deposited by PVD or any other any suitable method (e.g., CVD, etc.). Other conductive layer materials may be used. Barrier layer and/or adhesion layer 26 may include titanium nitride or another suitable layer such as tantalum nitride, tungsten nitride, tungsten, molybdenum, combinations of one or more layers, or any other suitable material(s). The deposited conductive layer 140 and barrier and/or adhesion layer 26 may be patterned and etched to form second conductors 22. In at least one embodiment, second conductors 22 are substantially parallel, substantially coplanar conductors that extend in a different direction than first conductors 20.

In other embodiments, second conductors 22 may be formed using a damascene process in which a dielectric layer is formed, patterned and etched to create openings or voids for conductors 22. The openings or voids may be filled with adhesion layer 26 and conductive layer 140 (and/or a conductive seed, conductive fill and/or barrier layer if needed). Adhesion layer 26 and conductive layer 140 then may be planarized to form a planar surface.

Following formation of second conductors 22, the resultant structure may be annealed to crystallize the deposited semiconductor material of diodes 14 (and/or to form silicide regions by reaction of the silicide-forming metal layer 52 with p+ region 14c). The lattice spacing of titanium silicide and cobalt silicide are close to that of silicon, and it appears that such silicide layers may serve as "crystallization templates" or "seeds" for adjacent deposited silicon as the deposited silicon crystallizes. Lower resistivity diode material thereby is provided. Similar results may be achieved for silicon-germanium alloy and/or germanium diodes.

Thus in at least one embodiment, a crystallization anneal may be performed for about 10 seconds to about 2 minutes in nitrogen at a temperature of about 600 to 800° C., and more preferably between about 650 and 750° C. Other annealing times, temperatures and/or environments may be used.

Figure 4J:
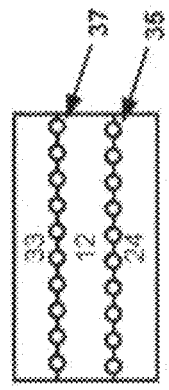
FIG. 4J depicts TiC contacts 35 and 37 between the CNT material 12 and the top 33 and bottom 24 electrode, respectively.
Figure 4I:
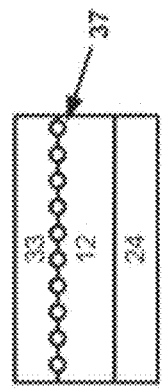
FIG. 4I depicts TiC contacts 37 between the CNT material 12 and the top electrode 33.
Figure 4H:
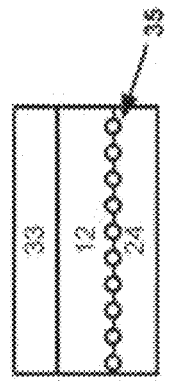
FIG. 4H depicts TiC contacts 35 between the CNT material 12 and the bottom electrode 24.

This crystallization anneal may also cause CNT element 12 and Ti-rich TiN bottom electrode 24 to interact to form TiC contacts 35 (FIG. 4H) between CNT element 12 and Ti-rich TiN bottom electrode 24. As described above, because all of the CNT material in CNT element 12 does not make contact with Ti-rich TiN bottom electrode 24, persons of ordinary skill in the art will understand that there may be a localized variance in composition. The Ti-rich TiN material is still in contact with the CNT element even when the TiC contacts are formed.

Persons of ordinary skill in the art will understand that a subsequent anneal at temperatures of about 700° C. or higher (e.g., such as at about 750° C. as described below) alternatively may be used to form TiC contacts between CNT element 12 and Ti-rich TiN bottom electrode 24.

Additional memory levels may be similarly formed above the memory level of FIGS. 4A-G. Persons of ordinary skill in the art will understand that alternative memory cells may be fabricated with other suitable techniques.

The foregoing description discloses only exemplary embodiments. Modifications of the above disclosed apparatus and methods which fall within the scope of the invention will be readily apparent to those of ordinary skill in the art. For instance, in any of the above embodiments, the carbon-based material may be located below diode(s) 14.

Additionally, the techniques described above with respect to bottom electrodes may be used with top electrodes. That is, a CNT MIM stack may be formed that includes a top electrode that includes a Ti-rich TiN material layer that contacts the CNT material. Alternatively, a CNT MIM stack may be formed that includes TiC contacts 37 (FIG. 4I) between the CNT material 12 and the top electrode 33.

Moreover, the various techniques may be combined, such that a CNT MIM stack may be formed that includes a top electrode that includes a Ti-rich TiN material layer that contacts the CNT material, and a bottom electrode that includes a Ti-rich TiN material layer that contacts the CNT material. Likewise, a CNT MIM stack may be formed that includes TiC contacts 35 and 37 (FIG. 4J) between the CNT material 12 and the top 33 and bottom 24 electrode.

FIG. 5 shows another embodiment of a MIM memory cell 200. FIG. 5 shows conductor layers 202 and 204 which may be bit lines or word lines. Between conductor layers 202 and 204 is the MIM structure that includes top electrode 224 in contact with conductor layer 202, bottom electrode 220 in contact with conductor layer 204, and carbon-based reversible resistance switching element 222 (e.g., carbon nanotubes layer) between and in contact with bottom electrode 220 and top electrode 224. In one embodiment, there can be additional layers between bottom electrode 220 and conductor layer 204, as well as between top electrode 224 and conductor layer 202. In one embodiment, the carbon-based reversible resistance switching element 222 can also include filler (e.g., silicon).

Bottom electrode 220 and top electrode 224 of FIG. 5 can be the same as bottom electrode 24 and top electrode 33, respectively, and can be made from the same materials and made from the same processes as described above. Similarly, carbon-based reversible resistance switching element 222 can be the same as CNT element 12, and can be made from the same materials and made from the same processes as described above. Note that the embodiment of FIG. 5 does not include a steering element. In other variations, a steering element (any described above) can be included.

In one embodiment, the memory cells can be set from the high resistance state to the low resistance state by applying a SET voltage Vset and reset from the low resistance state to the high resistance state by applying a RESET voltage Vreset. For some examples, see U.S. Pat. No. 7,869,258, incorporate herein by reference in its entirety. FIG. 6A shows a sample of Traditional Operation where Vset and Vreset are both applied as positive pulses or pulses of the same polarity.

Figure 6C:
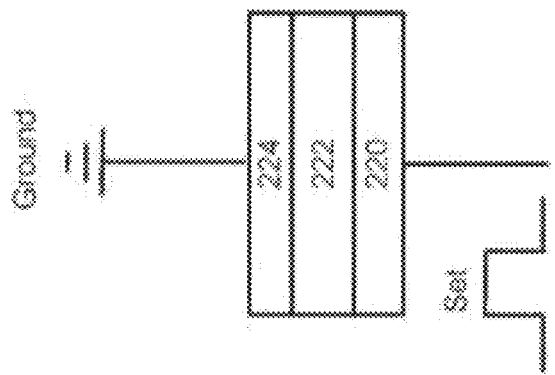
FIGS. 6B and 6C depict an operation of programming a memory cell, where set and reset operations use opposite polarity voltage pulses.
Figure 6B:
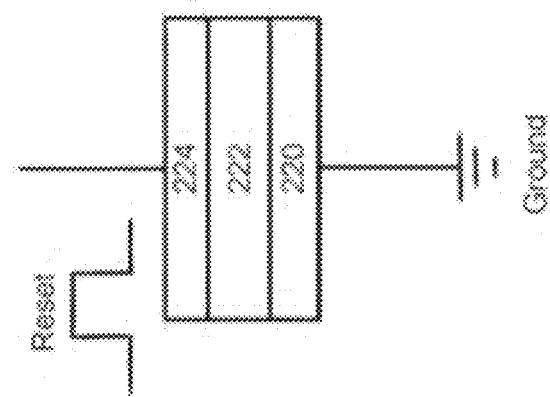
Figure 6A:
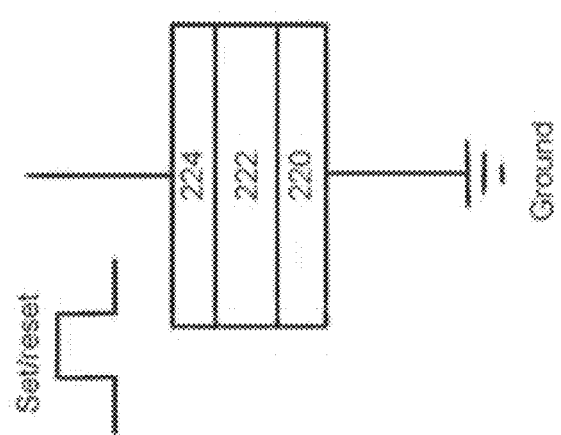
FIG. 6A depicts an operation of programming a memory cell, where set and reset operations use a same polarity voltage pulse.

FIGS. 6B and 6C depict an operation of programming a memory cell, where set and reset operations use opposite polarity voltage pulses. This New Operation proposed is to apply Vset as a first polarity voltage pulse and Vreset as a second polarity voltage pulse, where the first polarity pulse is of opposite polarity than the second polarity pulse. There are multiple means to achieve the opposite polarity pulses. In one example, the RESET operation is performed by applying the RESET voltage at the top electrode 224 with the bottom electrode 220 connected to ground, and the SET operation is performed by applying the SET voltage from at the bottom electrode 220, with the top electrode 224 connected to ground. By applying the SET pulse at the bottom electrode 220, the SET operation is performed much faster than in the past (e.g., as low as 50 ns). By applying the RESET pulse at the top electrode 224, the SET operation is performed as fast as in the past.

Figure 7:
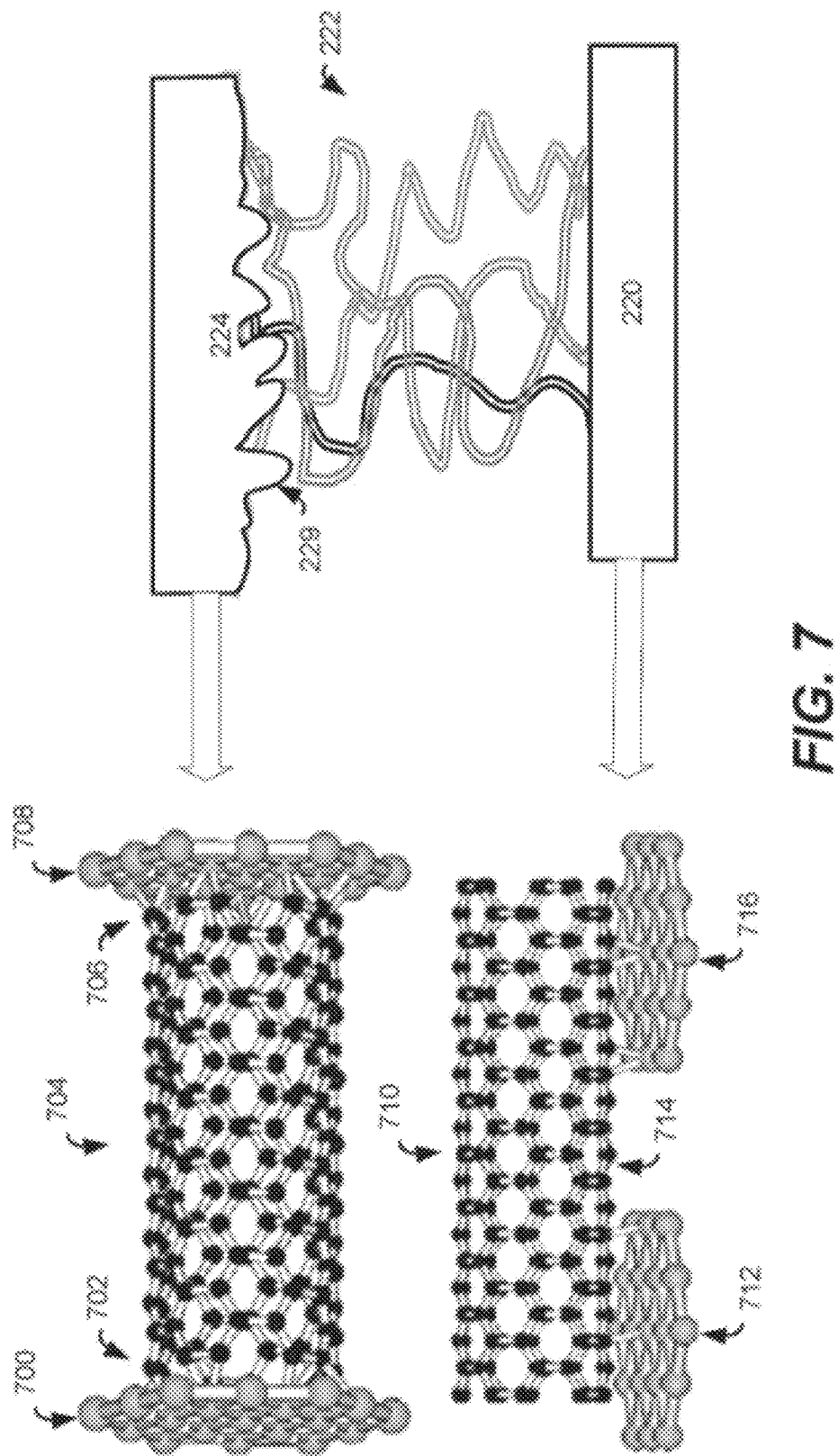
FIG. 7 depicts a model to explain behavior of a memory cell

FIG. 7 provides one possible explanation for the improved performance of the proposed New Operation of FIGS. 6B and 6C. The left-hand side of the figure is from F. Banhart, Interactions between metals and carbon nanotubes: at the interface between old and new materials, Nanoscale, 2009, 1, 201-213 (courtesy of J.J. Palacios and American Physical Society), incorporated herein by reference. There can be two types of interfaces between a metal crystal (e.g., bottom electrode 220 and top electrode 224) and a carbon nanotube: end contact (top view) and side contact (bottom view). In the top view, a CNT 704 (representing the carbon-based reversible resistance switching element 226) has one end 702 contacting a metal crystal 700 and an opposing end 706 contacting a metal crystal 708, where the metal crystals represent one of the electrodes 220 or 224. In the bottom view, a CNT 710 (representing the carbon-based reversible resistance switching element 226) has a bottom surface 714 contacting metal crystals 712 and 716, where the metal crystals represent one of the electrodes 220 or 224.

The right hand side of FIG. 7 depicts the bottom electrode 220, carbon-based reversible resistance switching element 222 and top electrode 224 from FIG. 5. In this example, irregular regions 229 are depicted at the top electrode 224.

In some embodiments, the carbon nanotubes interface with the bottom electrode 220 using side contact (as shown at FIG. 7, lower left) and interface with the top electrode 224 using end contact (as shown at FIG. 7, upper left).

In one example method of fabrication, bottom electrode 220 is added to the structure first, followed by the carbon nanotubes, and followed by the top electrode 224. When the carbon nanotubes are added on top of bottom electrode 220, a side contact is created (initially or later on). When the top electrode 224 is added on top of the carbon nanotubes an end contact is created (initially or later on).

Due to natural processes, it is more likely that the end 700 of the CNT contacts the top electrode 224 and that the side 710 of the CNT contacts the bottom electrode 220.

Figure 8B:
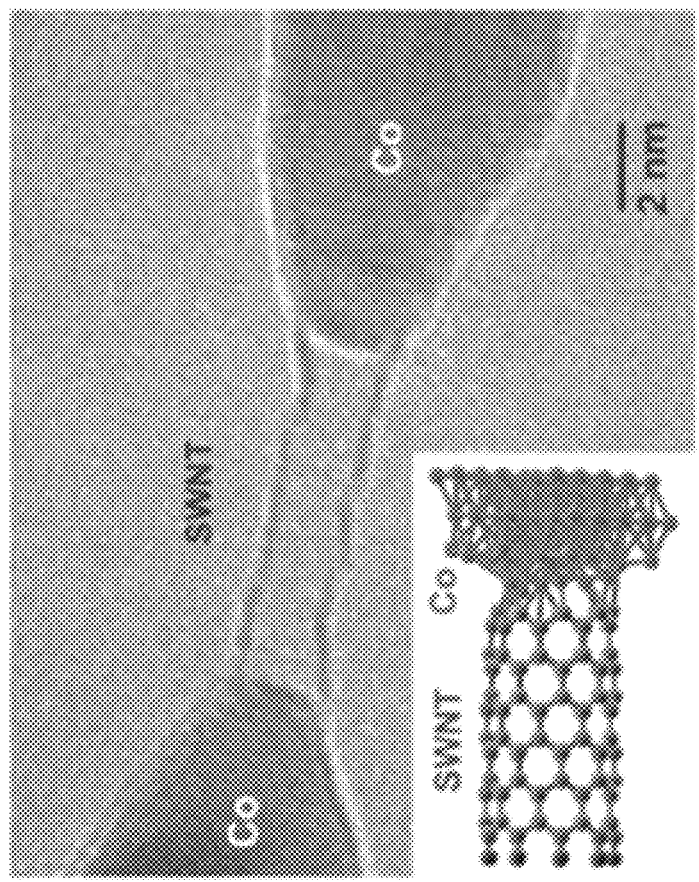
FIGS. 8A and 8B depict end contacts between metal and carbon nanotubes.
Figure 8A:
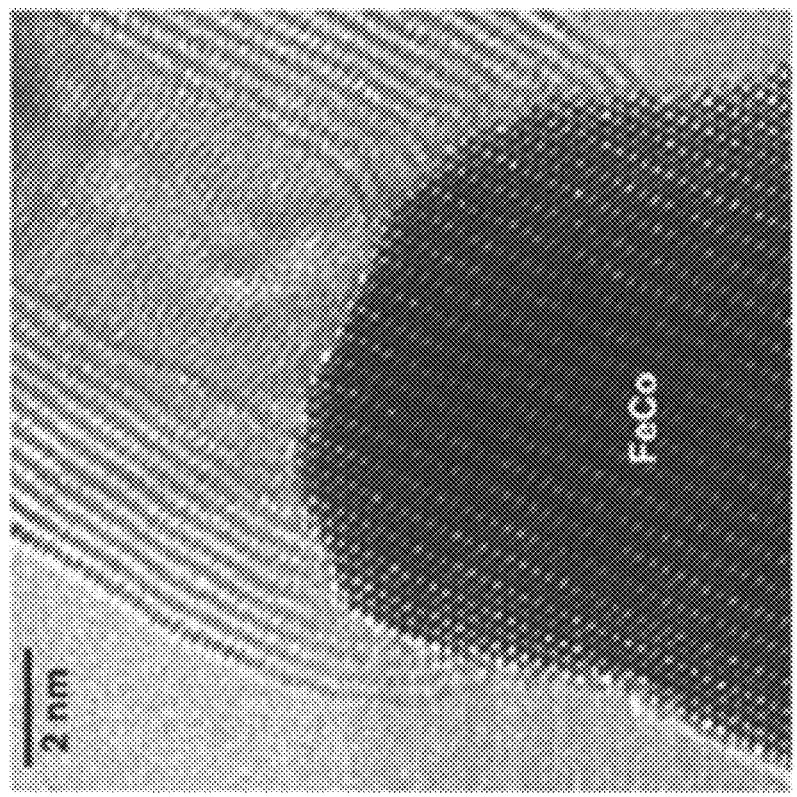

FIGS. 8A and 8B depict end contacts between metal and carbon nanotubes. The figures are from the above-mentioned F. Banhart article. In particular, FIG. 8A provides a Scanning Transmission Electron Microscopy (STEM) image of an end contact junction between a FeCo (alloy) crystal and a multi-walled carbon nanotube (MWNT) as obtained from CVD synthesis on CNTs in the presence of metallocenes. FIG. 8B depicts end contacts between a single-walled nanotube (SWNT) and Co crystals. A SWNT bridges the gap between two Co cones. The inset (Courtesy of B. G. Sumpter and V. Meunier, Optimizing the Electronic Properties of carbon nanotubes using Amphoteric Doping, page 29, in "Multiscale Simulation Methods for Nanomaterials", Wiley (2008)) shows the structure of a SWNT-metal interface for the example of a (9,0) tube on a (111) surface of Co. (STEM image by J. A. Rodriguez-Manzo).

Figure 9:
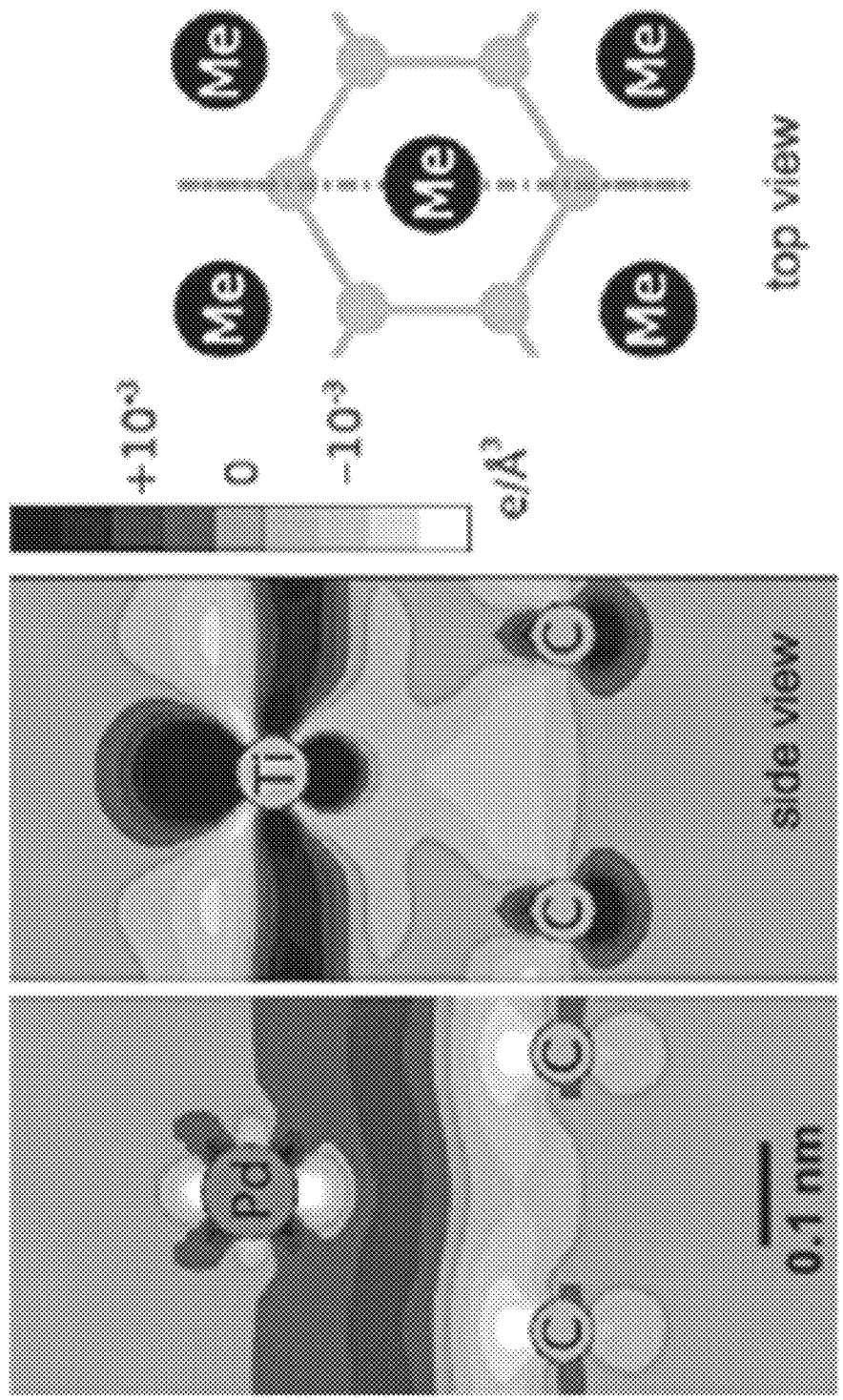
FIG. 9 depicts end contact between metal and carbon nanotubes.

FIG. 9 shows side contacts. The figure is from the above-mentioned F. Banhart article (Courtesy of D. Tomanek, American Physical Society). The figure shows a calculated charge-density distribution at the interface between monolayers of Pd (left image) and Ti (middle image) and a graphene layer. The right hand image shows a top-view of the geometry. The central vertical line indicates the cross-section in the charge density maps.

FIG. 10A depicts a memory cell 1000 which is provided by modifying the MIM memory cell 200 of FIG. 5 by providing a metal oxide layer 223 between the top electrode 224 and the carbon-based reversible resistance switching element 222, and a metal oxide layer 221 between the bottom electrode 220 and the carbon-based reversible resistance switching element 222. Generally, it is possible to add one or more other switching materials, such as metal oxide, to the memory cell, either on the top of the switching element 222, below the switching element 222, or both on top of and below the switching element 222. In one approach, the additional switching material (elements 221 and 223) is in contact with the switching element 222. The switching material on top of the switching element 222 can be the same as, or different than, the switching material on the bottom of the switching element 222. The terms top and bottom represent opposing sides of the different switching element 222.

In one approach, the switching element 222 and one or both of the metal oxide layers 221 and 223 are respective films or layers in a laminate 1002 which is used to optimize switching performance of a memory cell. The electrical properties of each film can be tuned, e.g., based on their thickness. The switching performance of the memory cell is therefore not limited by the characteristics of one film type.

A laminate is a material that can be constructed by uniting two or more layers of material together.

Each switching material type has some electrical properties inherent to the material that are favorable for integration with a diode, but also exhibit deficiencies. A laminate of different, alternating switching material types can therefore provide advantages. Tuning the various thicknesses of each material type can optimize the switching performance of the composite material. For example, the off current might be reduced by thinning the material with the largest off current while compensating with the alternating material. Additionally, interface states can be used to promote switching. Carbon can stabilize some phase change memory materials by heat dissipation and may aid in improving MeOx switching yield in a laminate.

The switching material laminate can be fabricated by alternating depositions of thin layers of each material type. For example, carbon/MeOx/carbon (FIG. 10D) and MeOx/carbon/MeOx (FIG. 10A are both acceptable laminates as well as stacks with many (2 or more) alternating layers. The deposition methods for each material type can include, but are not limited to, ALD, plasma enhanced vapor deposition (PVD), CVD, remote plasma deposition, sputtering, electron beam evaporation and electroplating.

The laminate can be integrated as a MIM-type switching element on either side of a diode steering element to create a read/write memory device. In one approach, the laminate is deposited onto the bottom wiring layers. Vertical pillar diodes are formed on top of the laminate while the diode and laminate are etched at the same masking step. In another approach, the vertical pillar diode can be created directly on top of the bottom wiring layers first. The laminate is deposited on top of the diode and a separate pattern masking and etch is required to isolate the laminate. In both cases, interconnects are then fabricated to connect the diode and laminate to the read/write circuitry.

The electrical operation of this switching material laminate should be equivalent to, or superior to, each material alone. Memory operation is based on a bistable resistance change in the carbon-MeOx laminate layers with the application of a high bias voltage (>4 V). Current through the memory cell is modulated by the resistance of the carbon-MeOx laminate layers. The cells are read at a lower voltage that will not change the resistance of the carbon-MeOx laminate layers. The difference in resistivities between the two states can be over 100×, for instance.

The cell is changed from a "0" to a "1" and back from a "1" to a "0," with the application of an appropriate bias.

This integration scheme can be extended to incorporate carbon-MeOx laminate films in series with a thin film transistor (TFT) as the steering element instead of the vertical pillar diode. The TFT steering element may be either planar or vertical. Three dimensional integration schemes of TFTs have been demonstrated, e.g., by Malhi et al., "Characteristics and three-dimensional integration of MOSFETs in small grain LPCVD polysilicon," IEEE J. Solid State Circuits, vol. SSC-20, pp. 178-201, February 1985, incorporated herein by reference.

FIG. 10B depicts a memory cell 1010 which is provided by modifying the MIM memory cell 200 of FIG. 5 by providing a metal oxide layer 223 between the top electrode 224 and the carbon-based reversible resistance switching element 222. A laminate 1012 is formed by layers 222 and 223. In one approach, the metal oxide layer 223 is in contact with the element 222.

FIG. 10C depicts a memory cell 1020 which is provided by modifying the MIM memory cell 200 of FIG. 5 by providing a metal oxide layer 221 between the bottom electrode 220 and the carbon-based reversible resistance switching element 222. A laminate 1022 is formed by layers 221 and 222. In one approach, the metal oxide layer 221 is in contact with the element 222.

FIG. 10D depicts a memory cell 1030 which is provided by modifying the MIM memory cell 200 of FIG. 5 by providing an additional carbon-based reversible resistance switching element 227, and a metal oxide layer 225 between the carbon-based reversible resistance switching elements 222 and 227. A laminate 1032 is formed by layers 222, 225 and 227. In one approach, the metal oxide layer 223 is in contact with the elements 222 and 227.

When a metal oxide layer is combined with a carbon-based reversible resistance switching element, it can play a role in forming a filament for switching. For example, the carbon-based reversible resistance switching element can act as a confinement layer or electrode for the metal oxide layer to confine the location of the filament. The metal oxide layer can switch its resistance state while the carbon-based reversible resistance switching element may not switch in this approach. A layer of 1-3 nm of metal oxide can be used, for instance.

The different switching elements are connected serially and may be in contact with one another.

Accordingly it can be seen that one embodiment of a non-volatile memory cell comprises a first electrode, a second electrode comprising a titanium-rich TiN material layer, and a carbon-based reversible resistivity switching material between the first electrode and the second electrode, and in contact with the carbon-based reversible resistivity switching material.

Another embodiment of a non-volatile memory cell comprises a first electrode, a second electrode, a carbon-based reversible resistivity switching material between the first electrode and the second electrode, and a metal oxide reversible resistivity switching material between the first electrode and the carbon-based reversible resistivity switching material.

In another embodiment, a non-volatile storage apparatus comprises a monolithic three dimensional array of non-volatile storage elements and control circuitry in communication with the non-volatile storage elements. The control circuitry sets the non-volatile storage elements to a low resistance state with a first polarity signal and resets the non-volatile storage elements to a higher resistance state with a second polarity signal. The first polarity signal is opposite in polarity than the second polarity signal. In some embodiments, the non-volatile storage elements are MIM structures with a carbon nanotube layer.

In another embodiment, a method of programming non-volatile storage comprises setting a non-volatile storage element from a high resistance state to a low resistance state using a first pulse and resetting the non-volatile storage element from the low resistance state to the high resistance state using a second pulse. The first pulse is opposite in polarity than the second pulse. In some embodiments, the method further comprises performing one or more verification processes for the non-volatile storage element when setting, performing one or more verification processes for the non-volatile storage element when resetting, and performing a read operation for the non-volatile storage element.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A non-volatile memory cell, comprising:
    a first electrode;
    a second electrode comprising a titanium-rich TiN material layer;
    a carbon-nanotube reversible resistivity switching material between the first electrode and the second electrode, and in contact with the first electrode and the second electrode; and
    TiC contacts between the titanium-rich TiN material layer and the carbon-nanotube reversible resistivity switching material, the TiC contacts comprise TiC material in which a carbon concentration is between about 1% to about 60%.

2. The non-volatile memory cell of claim 1, wherein:
   the TiC contacts comprise $Ti_xO_yC_zN_v$, where $x+y+z+v=1$, and any one or two of the following can be zero: y, v.

3. The non-volatile memory cell of claim 1, wherein:
   the first electrode comprises one or more of Ti, TiN, Ta, TaN, W, WN and Mo.

4. The non-volatile memory cell of claim 1, wherein:
   the carbon nanotube reversible resistivity switching material comprises carbon nanotubes which interface with the second electrode as a bottom electrode using side contact, and interface with the first electrode using end contact.

5. A non-volatile memory cell, comprising:
    a first electrode;
    a second electrode;
    a carbon-based reversible resistivity switching material between the first electrode and the second electrode;
    a metal oxide reversible resistivity switching material between the first electrode and the carbon-based reversible resistivity switching material; and
    an additional metal oxide reversible resistivity switching material between the carbon-based reversible resistivity switching material and the second electrode.

6. The non-volatile memory cell of claim 5, wherein:
   the carbon-based reversible resistivity switching material and the metal oxide reversible resistivity switching material are respective films in a laminate.

7. The non-volatile memory cell of claim 5, wherein:
   the carbon-based reversible resistivity switching material comprises a carbon nanotube material.

8. The non-volatile memory cell of claim 5, wherein:
   the carbon-based reversible resistivity switching material is in contact with the metal oxide reversible resistivity switching material.

9. The non-volatile memory cell of claim 5, wherein:
   the first electrode is a metal layer in a metal-insulator-metal structure;
   the second electrode is another metal layer in the metal-insulator-metal structure; and
   the carbon-based reversible resistivity switching material and the metal oxide reversible resistivity switching material are insulator layers in the metal-insulator-metal structure.

10. The non-volatile memory cell of claim 5, wherein:
    one of the first and second electrodes comprises a titanium-rich TiN material layer.

11. A non-volatile memory cell, comprising:
    a first electrode;
    a second electrode comprising a titanium-rich TiN material layer; and
    a carbon-nanotube reversible resistivity switching material between the first electrode and the second electrode, and in contact with the first electrode and the second electrode, wherein the carbon nanotube reversible resistivity switching material comprises carbon nanotubes which interface with the second electrode as a bottom electrode using side contact, and interface with the first electrode using end contact.

12. A non-volatile memory cell, comprising:
    a first electrode;
    a second electrode;
    a carbon-based reversible resistivity switching material between the first electrode and the second electrode;
    a metal oxide reversible resistivity switching material between the first electrode and the carbon-based reversible resistivity switching material; and
    an additional carbon-based reversible resistivity switching material between the metal oxide reversible resistivity switching material and the first electrode.

* * * * *